US009520350B2

(12) United States Patent
Teh et al.

(10) Patent No.: US 9,520,350 B2
(45) Date of Patent: Dec. 13, 2016

(54) BUMPLESS BUILD-UP LAYER (BBUL) SEMICONDUCTOR PACKAGE WITH ULTRA-THIN DIELECTRIC LAYER

(71) Applicants: Weng Hong Teh, Phoenix, AZ (US); Emile Davies-Venn, Gilbert, AZ (US); Ebrahim Andideh, Tempe, AZ (US); Digvijay A. Raorane, Chandler, AZ (US); Daniel N. Sobieski, Phoenix, AZ (US)

(72) Inventors: Weng Hong Teh, Phoenix, AZ (US); Emile Davies-Venn, Gilbert, AZ (US); Ebrahim Andideh, Tempe, AZ (US); Digvijay A. Raorane, Chandler, AZ (US); Daniel N. Sobieski, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 724 days.

(21) Appl. No.: 13/801,859

(22) Filed: Mar. 13, 2013

(65) Prior Publication Data

US 2014/0264830 A1 Sep. 18, 2014

(51) Int. Cl.
*H01L 23/498* (2006.01)
*H01L 23/532* (2006.01)
(Continued)

(52) U.S. Cl.
CPC ..... *H01L 23/49822* (2013.01); *H01L 23/5329* (2013.01); *H01L 23/53238* (2013.01);
(Continued)

(58) Field of Classification Search
CPC ............. H01L 23/19; H01L 21/7681; H01L 2924/18162; H01L 23/49822; H01L 23/5329; H01L 23/53295; H01L 23/53238; H01L 23/49811
See application file for complete search history.

(56) References Cited

U.S. PATENT DOCUMENTS

2011/0095418 A1*  4/2011  Lim et al. ............... 257/737
2011/0215464 A1*  9/2011  Guzek et al. ........... 257/737
(Continued)

OTHER PUBLICATIONS

Raghunathan, Vinodhkumar, et al., U.S. Appl. No. 13/630,500, Title 'Methods of Providing Dielectric to Conductor Adhesion in Package Structures', filed Sep. 28, 2012, 36 pgs.
(Continued)

*Primary Examiner* — Matthew Landau
*Assistant Examiner* — Krista Soderholm
(74) *Attorney, Agent, or Firm* — Blakely, Sokoloff, Taylor & Zafman LLP

(57) ABSTRACT

Bumpless build-up layer (BBUL) semiconductor packages with ultra-thin dielectric layers are described. For example, an apparatus includes a semiconductor die including an integrated circuit having a plurality of external conductive bumps. A semiconductor package houses the semiconductor die. The semiconductor package includes a dielectric layer disposed above the plurality of external conductive bumps. A conductive via is disposed in the dielectric layer and coupled to one of the plurality of conductive bumps. A conductive line is disposed on the dielectric layer and coupled to the conductive via.

15 Claims, 17 Drawing Sheets

(51) Int. Cl.
*H01L 21/768* (2006.01)
*H01L 23/00* (2006.01)

(52) U.S. Cl.
CPC .... *H01L 23/53295* (2013.01); *H01L 21/7681* (2013.01); *H01L 21/76807* (2013.01); *H01L 24/19* (2013.01); *H01L 2221/1026* (2013.01); *H01L 2224/12105* (2013.01); *H01L 2924/18162* (2013.01)

(56) References Cited

U.S. PATENT DOCUMENTS

2014/0093999 A1\* 4/2014 Teh et al. .................. 438/107
2014/0159250 A1\* 6/2014 Nickerson ............... H01L 24/19
257/774

OTHER PUBLICATIONS

Office Action for Korean Patent Application No. 20140029217, mailed Apr. 17, 2015, 6 pgs.

\* cited by examiner

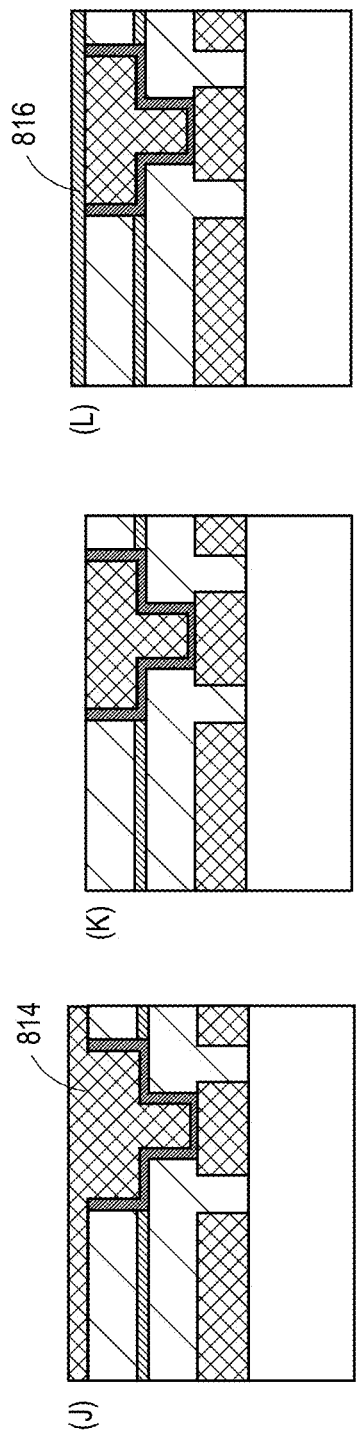

BUMPLESS BUILD-UP LAYER (BBUL) SEMICONDUCTOR PACKAGE WITH ULTRA-THIN DIELECTRIC LAYER

TECHNICAL FIELD

Embodiments of the invention are in the field of semiconductor packages and, in particular, bumpless build-up layer (BBUL) semiconductor packages with ultra-thin dielectric layers.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. On the other hand, although scaling is typically viewed as a reduction in size, multiples of packaged die are increasingly coupled together for advanced functionality and horse-power in a computing system. Also, the size of a particular semiconductor package may in fact be increased in order to include multiple die within a single semiconductor package.

However, structural issues may arise when attempting to couple multiples of packaged die. For example, the effect of differences in the coefficients of thermal expansion (CTE) between components used in the semiconductor packages can lead to detrimental defects when adding packaged die together. Similarly, the effect of differences in the coefficients of thermal expansion (CTE) between components used within a single semiconductor package can lead to detrimental defects as a result of performing a semiconductor die packaging process for more than one die within the single package.

Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables mixed technology die stacking or provide package stacking capability while maintaining a thin packaging profile and low overall warpage compatible with subsequent assembly processing.

Bumpless Build-Up Layer or BBUL is a processor packaging technology. It is bumpless since it does not use the usual tiny solder bumps to attach the silicon die to the processor package wires. It has build-up layers since it is grown or built-up around the silicon die. The usual way is to manufacture them separately and bond them together. Some semiconductor packages now use a coreless substrate, which does not include the thick resin core layer commonly found in conventional substrates.

BRIEF DESCRIPTION OF THE DRAWINGS

FIGS. 8A and 8B illustrate cross-sectional views of various operations in a process flow for build-up BBUL or substrate layers integration using dual damascene involving photolithography and/or laser drilling or plasma etch on a combination of photosensitive substrate build-up dielectric layers and/or other substrate build-up dielectric layer using a trench first-via last methodology, in accordance with another embodiment of the present invention.

DESCRIPTION OF THE EMBODIMENTS

Figure 1:
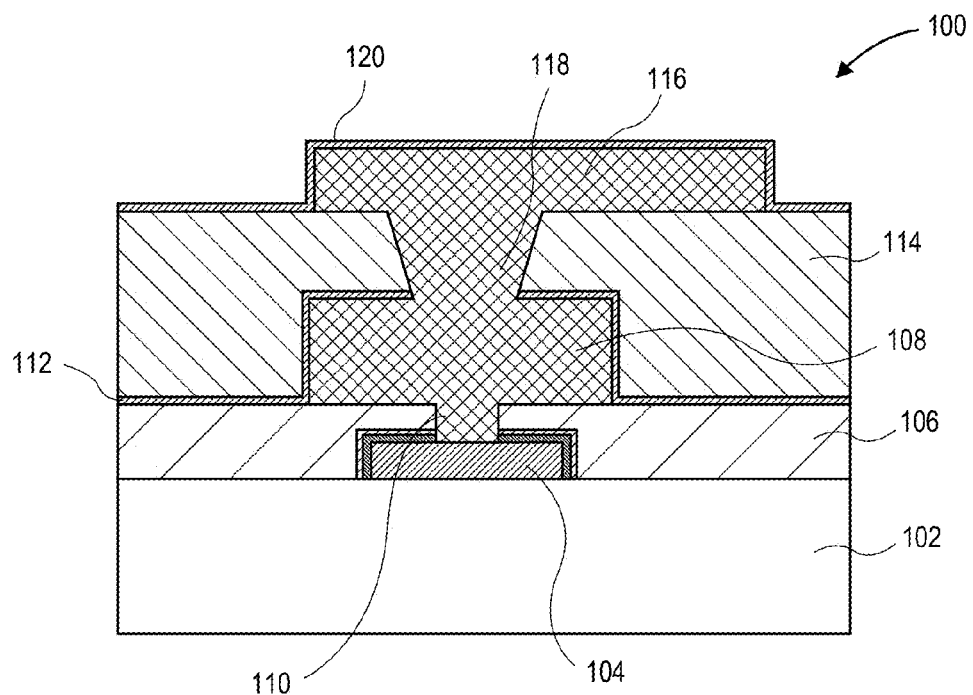
FIG. 1 illustrates a cross-sectional view of an embedded die-package interface, in accordance with an embodiment of the present invention.

Bumpless build-up layer (BBUL) semiconductor packages with ultra-thin dielectric layers are described. In the following description, numerous specific details are set forth, such as packaging integration schemes, in order to provide a thorough understanding of embodiments of the present invention. It will be apparent to one skilled in the art that embodiments of the present invention may be practiced without these specific details. In other instances, well-known features, such as routing design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to ultrathin dielectric layers for dual damascene structures in BBUL and related substrates. Embodiments may be specifically related to one or more of adhesion layers, BBUL interconnects, capping layers, diffusion barriers, dual damascene structures, etch stop layers, plasma enhanced chemical vapor deposited (PECVD (with alternative embodiments including one or more of CVD/LPCVD/MOCVD/APCVD/PVD)) layers, physical vapor deposited (PVD) layers, silicon carbide (SiC) layers, silicon nitride (SiN) layers, silicon oxynitride (SiON) layers, substrate interconnects, and titanium (with alternative embodiments including one or more of W, Ta etc.) structures. Embodiments may be applicable to variety of devices including mobile devices and/or system-on-chip (SoC) products.

More generally, the integration of ultrathin (e.g., 50-300 nanometer) dielectric thin film layers on BBUL-unique packaging bump-via 0-metal layer 1 (bump-V0-L1) interconnects (e.g., at a die-package interface) and classic substrate interconnects (e.g., build up regions) can enable scalability of packaging interconnects beyond 5 micron/5 micron (5 um/5 um) fine line spacing while using panel processing to reduce the overall packaging cost. The integration of a dual damascene structure using a combination of physical vapor deposition (PVD), plasma enhanced chemical vapor deposition, photo-sensitive substrate build-up dielectric film layers (or other similar laminated materials), and/or fine via/line laser drilling can enable significant increase in a selected local routing and interconnect density of a BBUL or substrate package. Such innovations can provide an approach to embedding heterogeneous functions, such as central processing unit (CPU) logic, graphics functions, cache memory and other system functions to create integrated system on embedded package designs. Such embedded package designs can enable lower product design complexity and component count on the customer end.

Additionally, the integration of a dielectric capping layer on top of fine line spacing (FLS) copper (Cu) lines (or substrates in general) can aid in eliminating the need for surface roughening and, hence, provide better margin for reducing insertion losses (e.g., due to skin effects) at high operating frequencies beyond 8 um/8 umFLS and future long transmission lines. The integration of a dual damascene structure using dry processing on top of silicon (Si) Cu bumps (a process unique to BBUL) helps to avoid the need of soft etch processing (which otherwise can remove portions, if not all, of the Cu bump) and, thus, allow a lower minimum requirement on the incoming Cu bump height to the BBUL packaging flow. In an embodiment, a PECVD (with alternative embodiments including one or more of CVD/LPCVD/MOCVD/APCVD/PVD)-based dielectric layer is implemented as an etch stop layer to define dual damascene structures in substrate and BBUL interconnects. In an embodiment, PVD-based Ti, W, Ta etc. layer or similar material is implemented as a hard mask layer to define dual damascene structures with a dual layer photosensitive substrate build-up dielectric stack. In an embodiment, a PECVD (with alternative embodiments including one or more of CVD/LPCVD/MOCVD/APCVD/PVD)-based SiN or similar material layer is implemented as a hermetic stop layer to define dual damascene structures with a dual layer photosensitive substrate build-up dielectric stack.

In order to provide further context, there is presently not a clear path to scaling BBUL or substrate interconnects packaging "manufacturing" design rules beyond 8 um/8 um FLS. However, it is understood that beyond the 8 um/8 um FLS transition point, existing manufacturing processes which are primarily built upon semi-additive processes will not work as in the past due to the sensitivity of future fine Cu lines/spacing and also process variation. Such current processing involves, e.g., using electroless plating for seed layers, laser drilling vias, and Cz roughening of Cu traces to provide mechanical anchoring of a next substrate build-up layer. There is an increasing need to adopt dry processes involving Si fab techniques such as, but not limited to, PVD or PECVD, etc. at these die/package transitional stages. For example, since the I/O density in a package substrate is determined by a minimum pad of the corresponding substrate and trace and space dimensions (which are limited by the capability of the substrate manufacturing processes), in accordance with an embodiment of the present invention, the routing density can be significantly enhanced using a dual damascene type structure in BBUL or substrate interconnect structures.

More specifically, in an embodiment, an embedded die-package interface for BBUL integration is provided with dual damascene on bump-V0-L1 interconnects. In another embodiment, build-up BBUL or substrate layers integration using dual damascene using laser drilling and/or plasma etch on dual substrate build-up dielectric layers is implemented by first-trench last or trench first-via last approaches. In another embodiment, build-up BBUL or substrate layers integration involving dual damascene using photolithography and/or laser drilling or plasma etch on a combination of photosensitive substrate build-up layer and substrate build-up dielectric stacks is implemented by first-trench last or trench first-via last approaches. In another embodiment, build-up BBUL or substrate layers integration involving dual damascene using photolithography on a photosensitive substrate build-up layer or stack is implemented by first-trench last or trench first-via last approaches. In another embodiment, build-up BBUL or substrate layers integration involving dual damascene using photolithography on a photosensitive substrate build-up dielectric layer or stack is implemented using a Ti, W, Ta etc.—based hard mask. In another embodiment, build-up BBUL or substrate layers integration involving dual damascene using photolithography on a photosensitive substrate build-up dielectric layer or stack is implemented using a SiN stop layer. In association with yet another embodiment, an apparatus surrounding the use of a thin dielectric film (PECVD (with alternative embodiments including one or more of CVD/LPCVD/MOCVD/APCVD/PVD)) to function as an etch stop layer and/or a substrate/BBUL interconnect capping layer is described.

Advantages of one or more described embodiments may include, but are not limited to, significantly enhancing routing density using the proposed dual damascene type structures in a BBUL or substrate interconnect structures manufacturing process since the I/O density in a package substrate is determined by the substrate's minimum pad, trace and space dimensions (limited by the capability of the substrate manufacturing processes). Examples include creating dual damascene structures in BBUL and/or substrate interconnects including the Si die to substrate interfacial layers by virtue of using the thin dielectric layers as etch stop layers and also as interconnect capping layers. References to a substrate build-up dielectric layer or the like may refer to, in an embodiment, an Ajinomoto build-up film (ABF) layer.

In a first aspect, FIG. 1 illustrates a cross-sectional view of an embedded die-package 100 interface, in accordance with an embodiment of the present invention. Referring to FIG. 1, the embedded die-package 100 is based on BBUL integration with implementation of dual damascene on bump-V0-L1 interconnects. More specifically, a silicon die 102 (e.g., a microprocessor or memory die, or the like, having an integrated circuit thereon) has disposed thereon a die pad 104 (e.g., a trench metal 1 (TM1) structure) covered by an insulator layer 106 (e.g., a WPR layer). An overlying conductive bump 108 (e.g., a copper bump (Si Cu bump)) is coupled to the die pad 104 by a trench via structure 110 (e.g., trench via 1 (TV1). A first dielectric layer 112 (e.g., a first layer of PECVD (with alternative embodiments including one or more of CVD/LPCVD/MOCVD/APCVD/PVD) SiN) is disposed over the conductive bump 108, and a substrate build-up dielectric layer or stack 114 overlies the first dielectric layer 112. An overlying BBUL metal layer 116 (e.g., BBUL L1) is coupled to the conductive bump 108 by a BBUL via structure 118 (e.g., BBUL V0). A second dielectric layer 120 (e.g., a second layer of PECVD (with alternative embodiments including one or more of CVD/LPCVD/MOCVD/APCVD/PVD) SiN) is disposed over the BBUL metal layer 116 and the exposed portions of the substrate build-up dielectric layer or stack 114.

Figure 2:
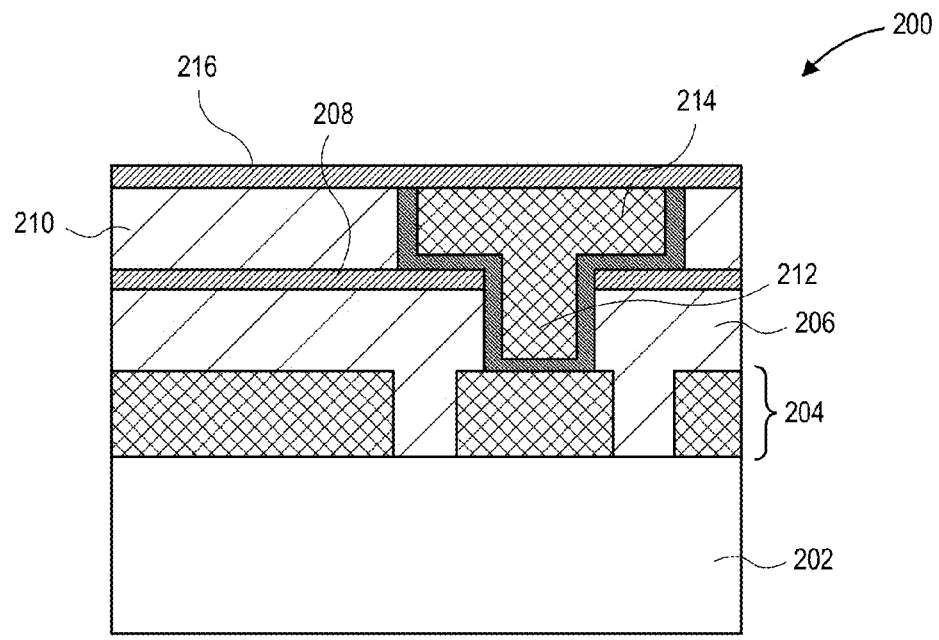
FIG. 2 illustrates a cross-sectional view of a structure fabricated by build-up BBUL or substrate layers integration, in accordance with another embodiment of the present invention.

In a second aspect, FIG. 2 illustrates a cross-sectional view of a structure 200 fabricated by build-up BBUL or substrate layers integration, in accordance with another embodiment of the present invention. Referring to FIG. 2, the structure 200 is fabricated by a dual damascene approach using laser drilling and/or plasma etch on dual substrate build-up dielectric layers using via first-trench last or trench first-via last methodologies. More specifically, an insulator panel 202 has a patterned metal routing layer 204 (e.g., a copper routing layer) disposed thereon. A first substrate dielectric build-up layer film 206 (e.g., a L1-L2layer) is disposed over the metal routing layer 204. A first dielectric layer 208 (e.g., a first PECVD (with alternative embodiments including one or more of CVD/LPCVD/MOCVD/APCVD/PVD) SiN layer) is disposed on the first substrate dielectric build-up layer film 206, and a second dielectric build-up layer film 210 (e.g., a L2 layer) is disposed on the first dielectric layer 208. A dual damascene structure having a via portion 212 and a line portion 214 is disposed in the second substrate dielectric build-up layer film 210, the first dielectric layer 208 and the first substrate dielectric build-up layer film 206 to contact a portion of the metal routing layer 204. As depicted in FIG. 2, the dual damascene structure may include a barrier metal layer and a fill metal layer (e.g., a copper fill layer), as is known for conventional copper dual damascene interconnect structures. A second dielectric layer 216 (e.g., a second PECVD (with alternative embodiments including one or more of CVD/LPCVD/MOCVD/APCVD/PVD) SiN layer) is disposed over the dual damascene structure and exposed portions of the second substrate dielectric build-up layer film 210. It is to be understood that the structure as defined above the insulator panel 202 can be removed from the insulator panel 202 as a package or package portion to ultimately house a semiconductor die, and to couple the metal routing layer 204 to external electrical contacts (e.g., bumps) of a semiconductor die. Alternatively, although not shown, the structure of FIG. 2 may include a semiconductor die disposed between the insulator panel 202 and the metal routing layer 204. That is, in the latter case, the build-up layers are fabricated directly on or over the semiconductor die.

Figure 3:
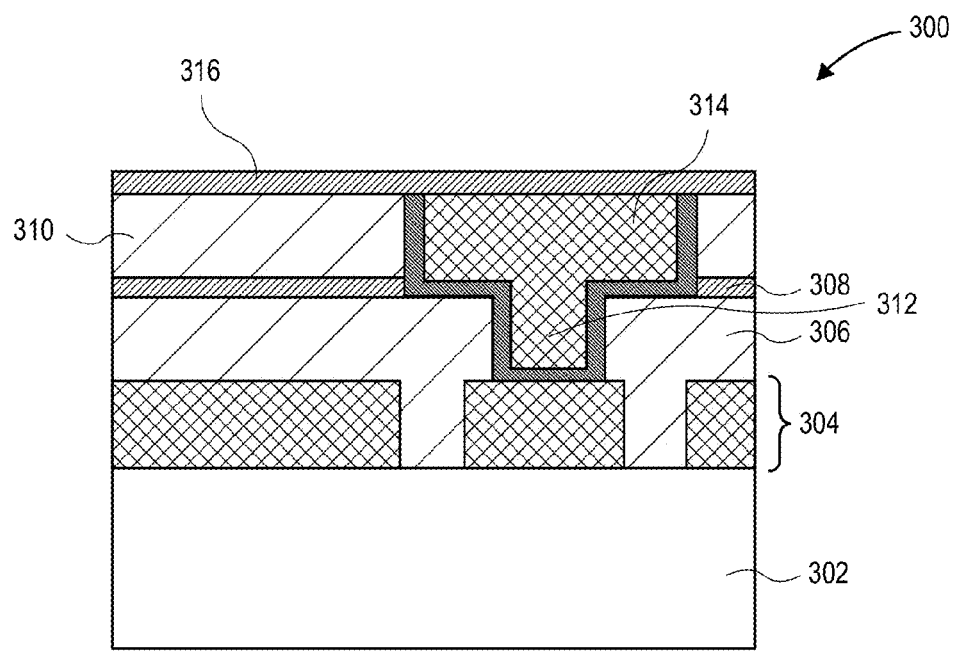
FIG. 3 illustrates a cross-sectional view of a structure fabricated by build-up BBUL or substrate layers integration, in accordance with another embodiment of the present invention.

In a third aspect, FIG. 3 illustrates a cross-sectional view of a structure 300 fabricated by build-up BBUL or substrate layers integration, in accordance with another embodiment of the present invention. Referring to FIG. 3, the structure 300 is fabricated by a dual damascene approach using photolithography and/or laser drilling or plasma etch on a combination of photosensitive substrate dielectric build-up layer and substrate dielectric build-up layer by a via first-trench last methodology. More specifically, an insulator panel 302 has a patterned metal routing layer 304 (e.g., a copper routing layer) disposed thereon. A photo-definable substrate dielectric build-up layer film 306 (e.g., a PID L1-L2 substrate dielectric build-up layer) is disposed over the metal routing layer 304. A first dielectric layer 308 (e.g., a first PECVD (with alternative embodiments including one or more of CVD/LPCVD/MOCVD/APCVD/PVD) SiN layer) is disposed on the photo-definable substrate dielectric build-up film 306, and a standard substrate dielectric build-up film 310 (e.g., a L2 substrate dielectric build-up layer) is disposed on the first dielectric layer 308. A dual damascene structure having a via portion 312 and a line portion 314 is disposed in the standard substrate dielectric build-up film 310, the first dielectric layer 308 and the photo-definable substrate dielectric build-up film 306 to contact a portion of the metal routing layer 304. As depicted in FIG. 3, the dual damascene structure may include a barrier metal layer and a fill metal layer (e.g., a copper fill layer), as is known for conventional copper dual damascene interconnect structures. A second dielectric layer 316 (e.g., a second PECVD (with alternative embodiments including one or more of CVD/LPCVD/MOCVD/APCVD/PVD) SiN layer) is disposed over the dual damascene structure and exposed portions of the standard substrate dielectric build-up film 310. It is to be understood that the structure as defined above the insulator panel 302 can be removed from the insulator panel 302 as a package or package portion to ultimately house a semiconductor die, and to couple the metal routing layer 304 to external electrical contacts (e.g., bumps) of a semiconductor die. Alternatively, although not shown, the structure of FIG. 3 may include a semiconductor die disposed between the insulator panel 302 and the metal routing layer

304. That is, in the latter case, the build-up layers are fabricated directly on or over the semiconductor die.

Figure 4:
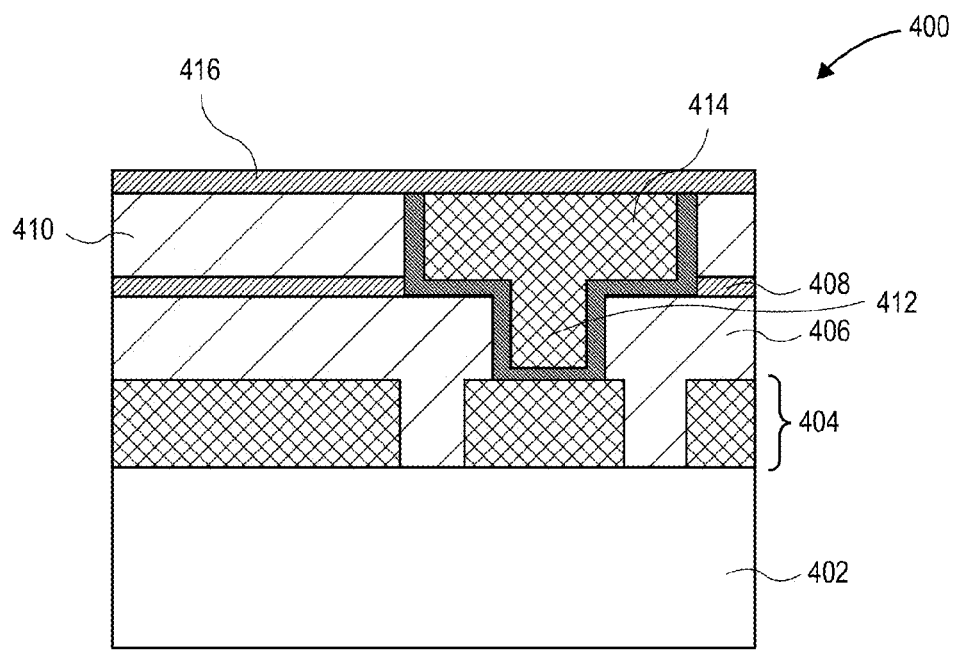
FIG. 4 illustrates a cross-sectional view of a structure fabricated by build-up BBUL or substrate layers integration, in accordance with another embodiment of the present invention.

In a fourth aspect, FIG. 4 illustrates a cross-sectional view of a structure 400 fabricated by build-up BBUL or substrate layers integration, in accordance with another embodiment of the present invention. Referring to FIG. 4, the structure 400 is fabricated by a dual damascene approach using photolithography and/or laser drilling or plasma etch on a combination of photosensitive substrate dielectric build-up layer and substrate dielectric build-up layer by a trench first-via last methodology. More specifically, an insulator panel 402 has a patterned metal routing layer 404 (e.g., a copper routing layer) disposed thereon. A standard substrate dielectric build-up film 406 (e.g., a L1-L2 substrate dielectric build-up layer) is disposed over the metal routing layer 404. A first dielectric layer 408 (e.g., a first PECVD (with alternative embodiments including one or more of CVD/LPCVD/MOCVD/APCVD/PVD) SiN layer) is disposed on the standard substrate dielectric build-up film 406, and a photo-definable substrate dielectric build-up film 410 (e.g., a PID L2 substrate dielectric build-up layer) is disposed on the first dielectric layer 408. A dual damascene structure having a via portion 412 and a line portion 414 is disposed in the photo-definable substrate dielectric build-up film 410, the first dielectric layer 408 and the standard substrate dielectric build-up film 406 to contact a portion of the metal routing layer 404. As depicted in FIG. 4, the dual damascene structure may include a barrier metal layer and a fill metal layer (e.g., a copper fill layer), as is known for conventional copper dual damascene interconnect structures. A second dielectric layer 416 (e.g., a second PECVD (with alternative embodiments including one or more of CVD/LPCVD/MOCVD/APCVD/PVD) SiN layer) is disposed over the dual damascene structure and exposed portions of the photo-definable substrate dielectric build-up film 410. It is to be understood that the structure as defined above the insulator panel 402 can be removed from the insulator panel 402 as a package or package portion to ultimately house a semiconductor die, and to couple the metal routing layer 404 to external electrical contacts (e.g., bumps) of a semiconductor die. Alternatively, although not shown, the structure of FIG. 4 may include a semiconductor die disposed between the insulator panel 402 and the metal routing layer 404. That is, in the latter case, the build-up layers are fabricated directly on or over the semiconductor die.

Figure 5:
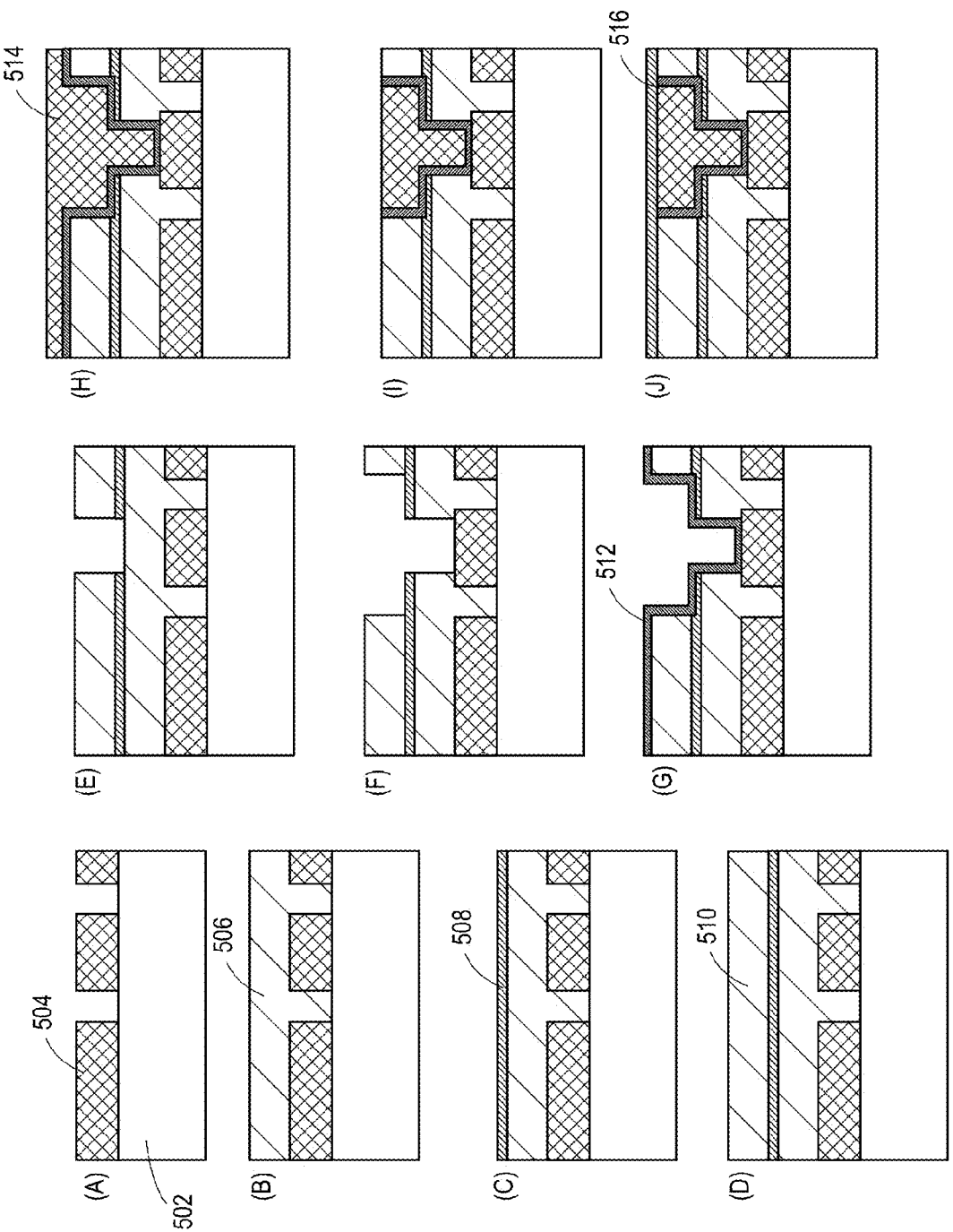
FIG. 5 illustrates cross-sectional views of various operations in a process flow for build-up BBUL or substrate layers integration using dual damascene involving laser drilling and/or plasma etch on dual substrate build-up dielectric layers using a via first-trench last methodology, in accordance with an embodiment of the present invention.

FIG. 5 illustrates cross-sectional views of various operations in a process flow for build-up BBUL or substrate layers integration using dual damascene involving laser drilling and/or plasma etch on dual build-up layer dielectric layers using a via first-trench last methodology, in accordance with an embodiment of the present invention. Referring to FIG. 5, in (A) an incoming panel 502 has level patterned L1 Cu layers 504, which can represent a stack of layers formed using a combination of substrate dielectric build-up layer lamination, laser drilling, and semi-additive lithographic/electroplating processes. The layer 504 can also represent Cu bumps in Si for a BBUL die-package interface dual damascene structure. In (B), a L1-L2 filler-filled substrate dielectric build-up layer 506 lamination is performed. A PECVD (with alternative embodiments including one or more of CVD/LPCVD/MOCVD/APCVD/PVD) deposition of a thin dielectric layer 508 (e.g., SiN, SiON, etc. from 20-300 nm thick) is performed to function as an etch stop layer for drilling/plasma etch, as shown in (C). In (D), a L2 filler-filled substrate dielectric build-up layer 510 lamination is performed. A laser drill or patterned plasma etch (via first) process is then performed and stops at the PECVD (with alternative embodiments including one or more of CVD/LPCVD/MOCVD/APCVD/PVD) SiN etch stop layer, as shown in (E). In (F), a laser drill or patterned plasma etch (trench last) is performed and stops at the PECVD (with alternative embodiments including one or more of CVD/LPCVD/MOCVD/APCVD/PVD) SiN etch stop layer for the trench while stopping at L1 Cu layer (or bumps layer) for the via simultaneously. An optional PECVD (with alternative embodiments including one or more of CVD/LPCVD/MOCVD/APCVD/PVD) thin dielectric capping layer (e.g., SiN, SiON, etc from 20-300 nm thick) may be formed over the L1 Cu layer which the laser or plasma etch would needs to break through depending on the final integration scheme. In (G), a PVD sputtered thin Ti, W, or Ta etc./Cu seed layer 512 (e.g., approximately 50 nm Ti, W, or Ta etc. and approximately 100-300 nm Cu) is deposited. Copper plating 514 of the dual damascene structure is then performed, as shown in (H). In (I), chemical mechanical planarization (CMP) of Cu overburden or use a flash etch wet process is performed. Then, Cu L2 capping and L2 substrate dielectric build-up layer capping using PECVD (with alternative embodiments including one or more of CVD/LPCVD/MOCVD/APCVD/PVD) dielectric layer 516 (e.g., SiN, SiON, etc, from 20-300 nm thick) is then performed, as shown in (J). It is to be understood that the process can subsequently include removing the structure of (J) from the insulator panel 502 as a package or package portion to ultimately house a semiconductor die, and to couple the metal routing layer 504 to external electrical contacts (e.g., bumps) of a semiconductor die. Alternatively, although not shown, the fabrication process of FIG. 5 may include performing the above described operation directly on or over a semiconductor die, such as a die disposed on a panel.

Figure 6:
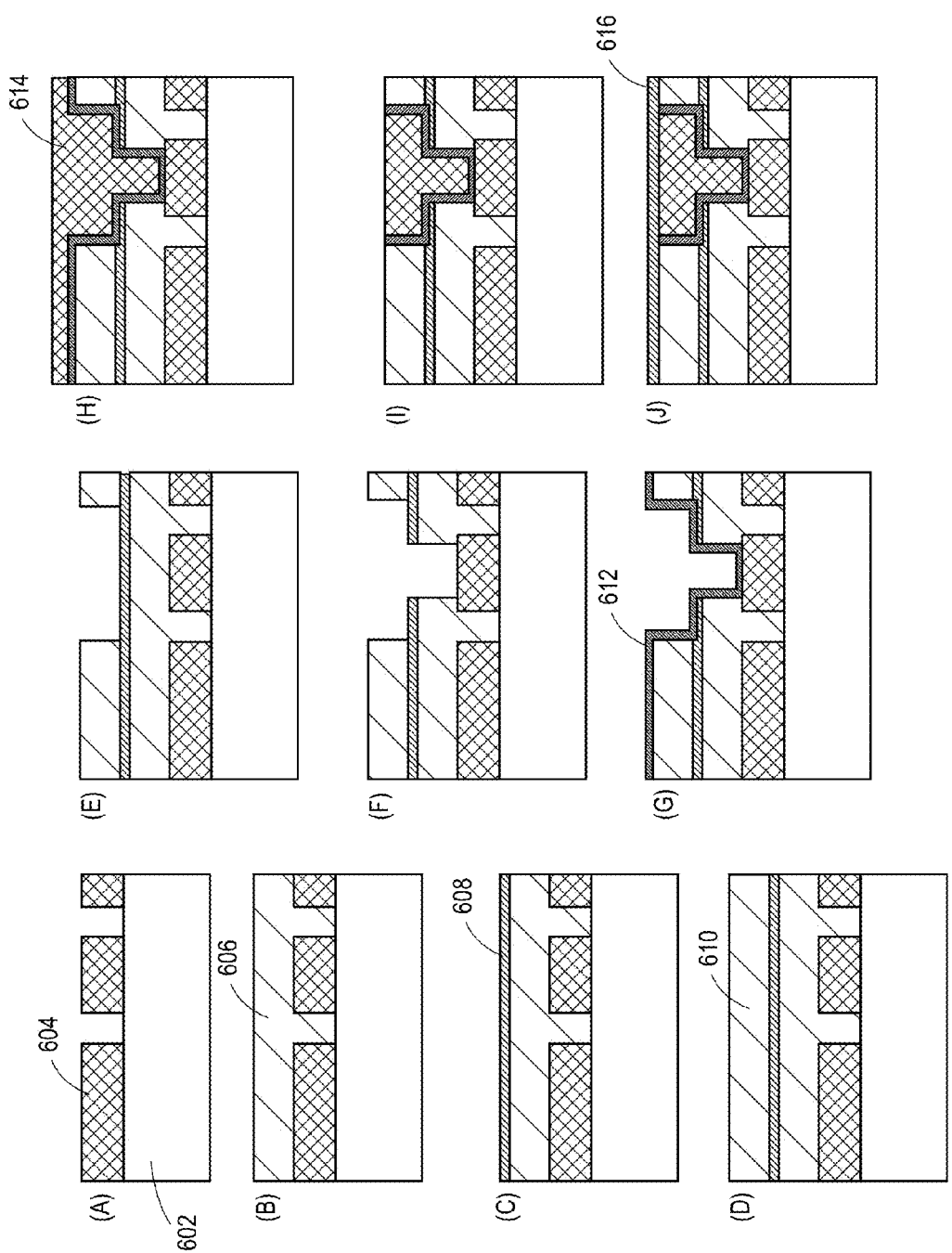
FIG. 6 illustrates cross-sectional views of various operations in a process flow for build-up BBUL or substrate layers integration using dual damascene involving laser drilling and/or plasma etch on dual substrate build-up dielectric layers using a trench first-via last methodology, in accordance with another embodiment of the present invention.

FIG. 6 illustrates cross-sectional views of various operations in a process flow for build-up BBUL or substrate layers integration using dual damascene involving laser drilling and/or plasma etch on dual substrate dielectric build-up layers using a trench first-via last methodology, in accordance with another embodiment of the present invention. Referring to FIG. 6, in (A) an incoming panel 602 has level patterned L1 Cu layers 604, which can represent a stack of layers formed using a combination of substrate dielectric build-up layer lamination, laser drilling, and semi-additive lithographic/electroplating processes. The layer 604 can also represent Cu bumps in Si for a BBUL die-package interface dual damascene structure. In (B), a L1-L2 filler-filled substrate dielectric build-up layer 606 lamination is performed. A PECVD (with alternative embodiments including one or more of CVD/LPCVD/MOCVD/APCVD/PVD) deposition of a thin dielectric layer 608 (e.g., SiN, SiON, etc. from 20-300 nm thick) is performed to function as an etch stop layer for drilling/plasma etch, as shown in (C). In (D), a L2 filler-filled substrate dielectric build-up layer 610 lamination is performed. A laser drill or patterned plasma etch (trench first) process is then performed and stops at the PECVD (with alternative embodiments including one or more of CVD/LPCVD/MOCVD/APCVD/PVD) SiN etch stop layer, as shown in (E). In (F), a laser drill or patterned plasma etch (via last) is performed and stops at the PECVD (with alternative embodiments including one or more of CVD/LPCVD/MOCVD/APCVD/PVD) SiN etch stop layer for the trench while stopping at L1 Cu layer (or bumps layer) for the via simultaneously. An optional PECVD (with alternative embodiments including one or more of CVD/LPCVD/MOCVD/APCVD/PVD) thin dielectric capping layer (e.g., SiN, SiON, etc from 20-300 nm thick) may be formed over the L1 Cu layer which the laser or plasma etch would needs to break through depending on the final integration scheme. In (G), a PVD sputtered thin Ti, W, or Ta etc./Cu seed layer 612 (e.g., approximately 50 nm Ti, W, or Ta etc. and approximately 100-300 nm Cu) is deposited. Copper plating 614 of the dual damascene structure is then performed, as shown in (H). In (I), chemical mechanical planarization (CMP) of Cu overburden or use a flash etch wet process is performed. Then, Cu L2 capping and L2 build-up layer capping using PECVD (with alternative embodiments including one or more of CVD/LPCVD/MOCVD/APCVD/PVD) dielectric layer 616 (e.g., SiN, SiON, etc, from a few up to 300 nm thick) is then performed, as shown in (J). It is to be understood that the process can subsequently include removing the structure of (J) from the insulator panel 602 as a package or package portion to ultimately house a semiconductor die, and to couple the metal routing layer 604 to external electrical contacts (e.g., bumps) of a semiconductor die. Alternatively, although not shown, the fabrication process of FIG. 6 may include performing the above described operation directly on or over a semiconductor die, such as a die disposed on a panel.

Figure 7:
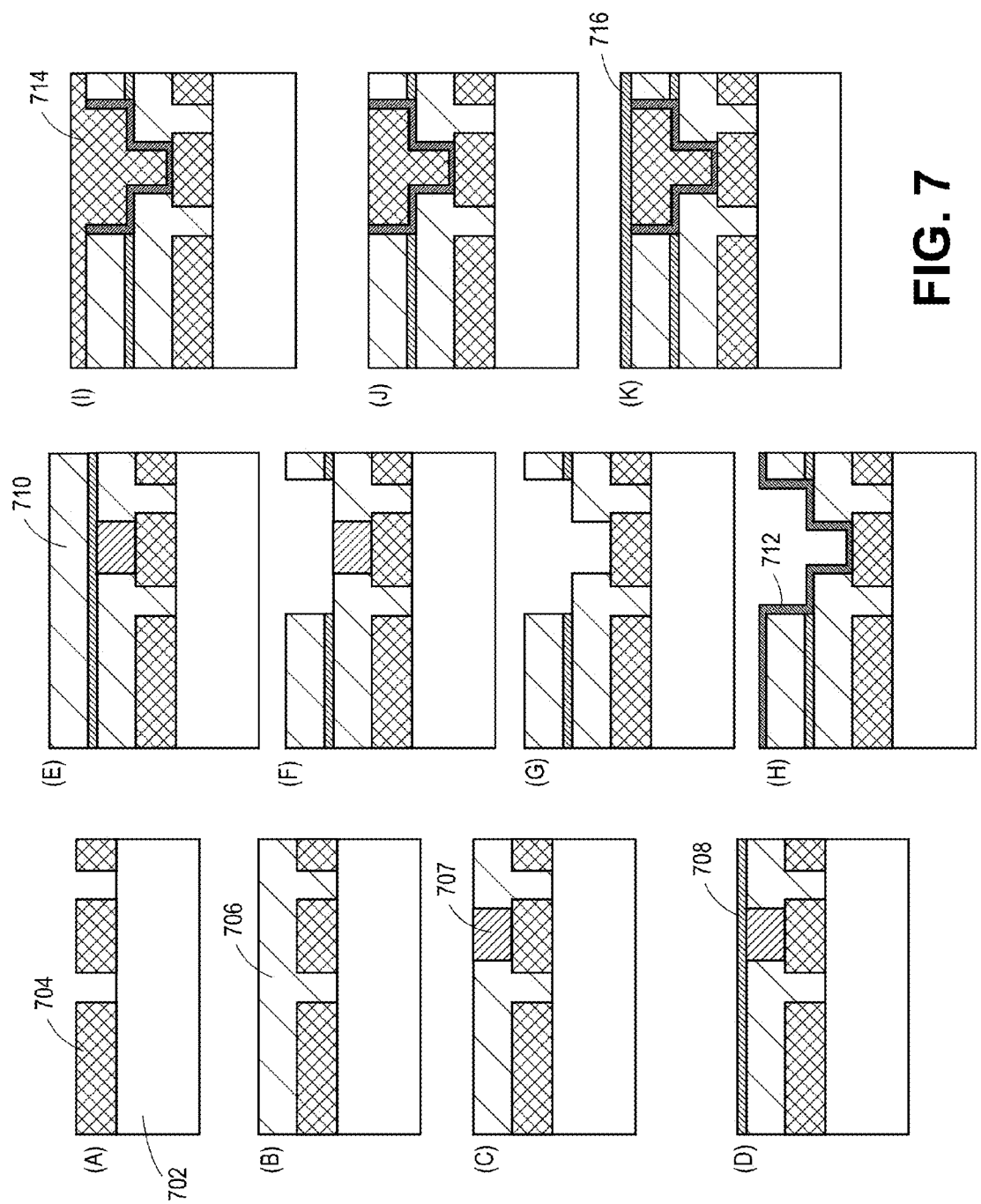
FIG. 7 illustrates cross-sectional views of various operations in a process flow for build-up BBUL or substrate layers integration using dual damascene involving photolithography and/or laser drilling or plasma etch on a combination of photosensitive substrate build-up dielectric layers and/or other substrate build-up dielectric layers using a via first-trench last methodology, in accordance with another embodiment of the present invention.

FIG. 7 illustrates cross-sectional views of various operations in a process flow for build-up BBUL or substrate layers integration using dual damascene involving photolithography and/or laser drilling or plasma etch on a combination of photosensitive substrate dielectric build-up layer and substrate dielectric build-up layer using a via first-trench last methodology, in accordance with another embodiment of the present invention. Referring to FIG. 7, in (A) an incoming panel 702 has level patterned L1 Cu layers 704, which can represent a stack of layers formed using a combination of substrate dielectric build-up layer lamination, laser drilling, and semi-additive lithographic/electroplating processes. The layer 704 can also represent Cu bumps in Si for a BBUL die-package interface dual damascene structure. In (B), a photosensitive (PID) substrate dielectric build-up layer 706 lamination or spin-on liquid deposition is performed. In (C), align and photo-exposure of the PID L1-L2 substrate dielectric build-up layer (via first 707) is performed. A PECVD (with alternative embodiments including one or more of CVD/LPCVD/MOCVD/APCVD/PVD) deposition of a thin dielectric layer 708 (e.g., SiN, SiON, etc. from 20-300 nm thick) is performed to function as an etch stop layer for drilling/plasma etch, as shown in (D). In (E), a L2 filler-filled substrate dielectric build-up layer 710 lamination is performed. A laser drill or patterned plasma etch (trench first) process is then performed and stops at the PECVD (with alternative embodiments including one or more of CVD/LPCVD/MOCVD/APCVD/PVD) SiN etch stop layer, as shown in (F). In (G), the pre-exposed via is developed on the PID L1-L2 substrate dielectric build-up layer. An optional PECVD (with alternative embodiments including one or more of CVD/LPCVD/MOCVD/APCVD/PVD) thin dielectric capping layer (e.g., SiN, SiON, etc from 20-300 nm thick) may be formed over the L1 Cu layer which the laser, plasma or wet etch would needs to break through depending on the final integration scheme. In (H), a PVD sputtered thin Ti, W, or Ta etc./Cu seed layer 712 (e.g., approximately 50 nm Ti, W, or Ta etc. and approximately 100-300 nm Cu) is deposited. Copper plating 714 of the dual damascene structure is then performed, as shown in (I). In (J), chemical mechanical planarization (CMP) of Cu overburden or use a flash etch wet process is performed. Then, Cu L2 capping and L2 substrate dielectric build-up layer capping using PECVD (with alternative embodiments including one or more of CVD/LPCVD/MOCVD/APCVD/PVD) dielectric layer 716 (e.g., SiN, SiON, etc, from 20-300 nm thick) is then performed, as shown in (K). It is to be understood that the process can subsequently include removing the structure of (K) from the insulator panel 702 as a package or package portion to ultimately house a semiconductor die, and to couple the metal routing layer 704 to external electrical contacts (e.g., bumps) of a semiconductor die. Alternatively, although not shown, the fabrication process of FIG. 7 may include performing the above described operation directly on or over a semiconductor die, such as a die disposed on a panel.

Figure 8A:
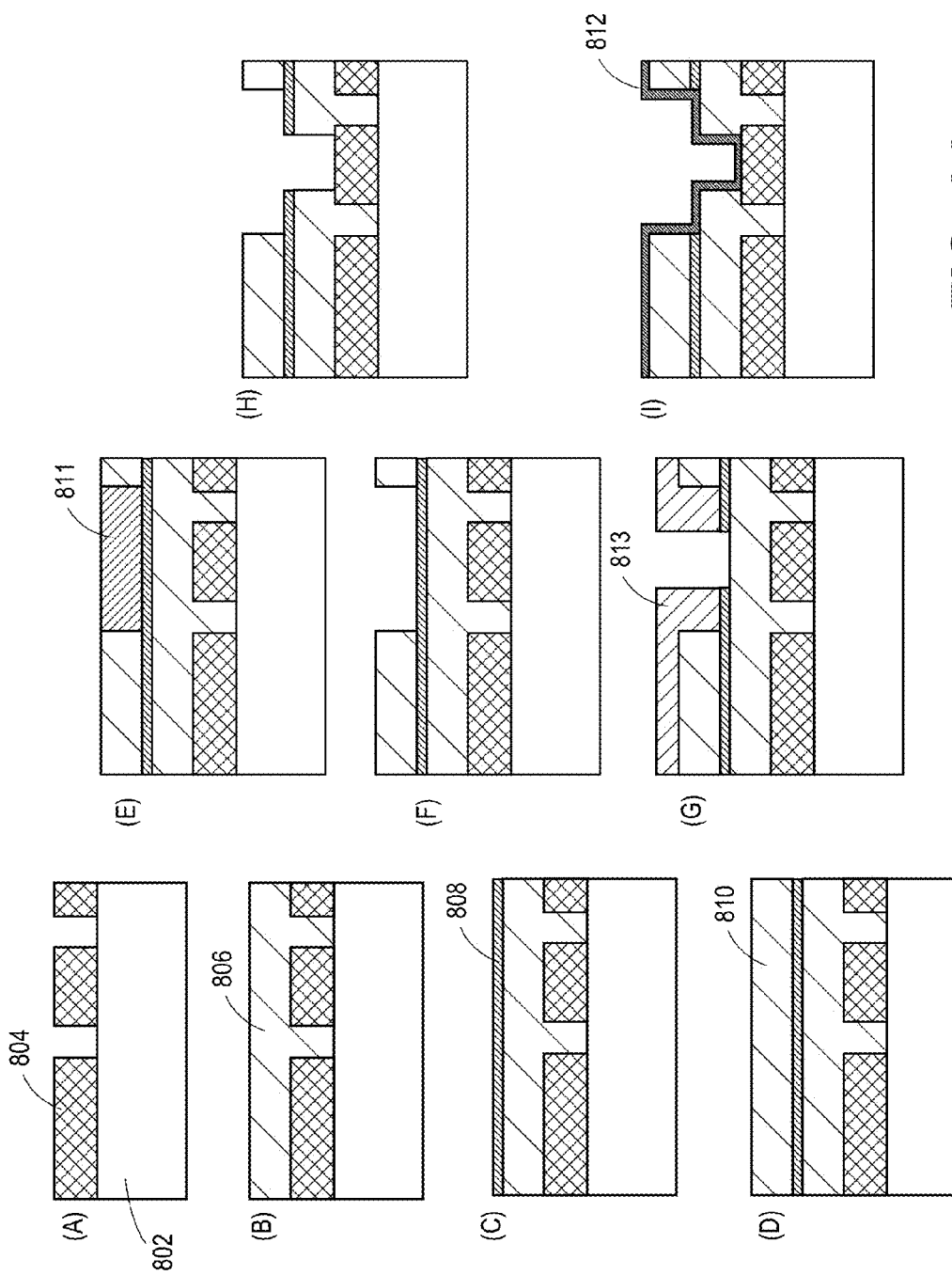

FIGS. 8A and 8B illustrate cross-sectional views of various operations in a process flow for build-up BBUL or substrate layers integration using dual damascene involving photolithography and/or laser drilling or plasma etch on a combination of photosensitive substrate dielectric build-up layer substrate dielectric build-up layer using a trench first-via last methodology, in accordance with another embodiment of the present invention. Referring to FIGS. 8A and 8B, in (A) an incoming panel 802 has level patterned L1 Cu layers 804, which can represent a stack of layers formed using a combination of substrate dielectric build-up layer lamination, laser drilling, and semi-additive lithographic/electroplating processes. The layer 804 can also represent Cu bumps in Si for a BBUL die-package interface dual damascene structure. In (B), a L1-L2 filler-filled substrate dielectric build-up layer 806 lamination is performed. A PECVD (with alternative embodiments including one or more of CVD/LPCVD/MOCVD/APCVD/PVD) deposition of a thin dielectric layer 808 (e.g., SiN, SiON, etc. from a few up to—300 nm thick) is performed to function as an etch stop layer for develop/exposure stop layer, as shown in (C). In (D), a L2 photosensitive (PID) substrate dielectric build-up layer 810 lamination or spin-on liquid deposition is performed. An align and photo-exposure of the PID L2 substrate dielectric build-up layer (trench first 811) is then performed, as shown in (E). In (F), the pre-exposed trench on the PID L2 substrate dielectric build-up layer is developed. The hermetic thin film PECVD (with alternative embodiments including one or more of CVD/LPCVD/MOCVD/APCVD/PVD) dielectric layer (in particular SiN) can be used to "develop stop" the developer. A photo-resist layer 813 is then laminated or spun-on, exposed and developed to define the via, as shown in (G). In (H), using the photo-resist patterning of the via, a plasma etch is performed to define the via last structure, stopping at L1 Cu layer (or a bumps layer). The photo-resist is then stripped off. An optional PECVD (with alternative embodiments including one or more of CVD/LPCVD/MOCVD/APCVD/PVD) thin dielectric capping layer (e.g., SiN, SiON, etc from 20-300 nm thick) may be formed over the L1 Cu layer which the laser or plasma etch would needs to break through depending on the final integration scheme. In (I), a PVD sputtered thin Ti, W, or Ta etc./Cu seed layer 812 (e.g., approximately 50 nm Ti, W, or Ta etc. and approximately 100-300 nm Cu) is deposited. Copper plating 814 of the dual damascene structure is then performed, as shown in (J). In (K), chemical mechanical planarization (CMP) of Cu overburden or use a flash etch wet process is performed. Then, Cu L2 capping and L2 substrate dielectric build-up layer capping using PECVD (with alternative embodiments including one or more of CVD/LPCVD/MOCVD/APCVD/PVD) dielectric layer 816 (e.g., SiN, SiON, etc, from 20-300 nm thick) is then performed, as shown in (L). It is to be understood that the process can subsequently include removing the structure of (L) from the insulator panel 802 as a package or package portion to ultimately house a semiconductor die, and to couple the metal routing layer 804 to external electrical contacts (e.g., bumps) of a semiconductor die. Alternatively, although not shown, the fabrication process of FIGS. 8A and 8B may include performing the above described operation directly on or over a semiconductor die, such as a die disposed on a panel.

Figure 9:
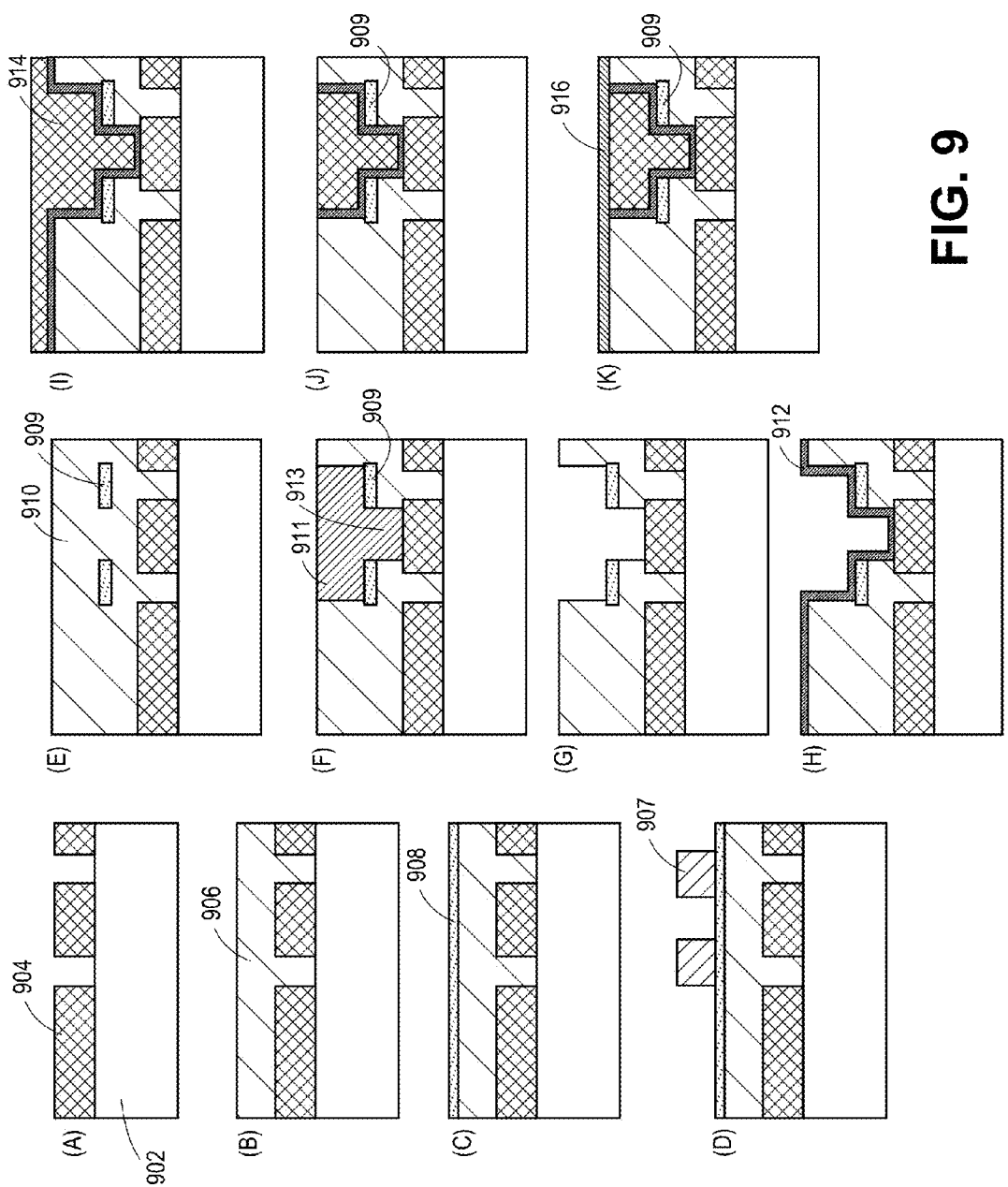
FIG. 9 illustrates cross-sectional views of various operations in a process flow for build-up BBUL or substrate layers integration using dual damascene involving photolithography and Ti, W, or Ta etc. a hard mask based on dual photosensitive substrate build-up dielectric layers, in accordance with another embodiment of the present invention.

FIG. 9 illustrates cross-sectional views of various operations in a process flow for build-up BBUL or substrate layers integration using dual damascene involving photolithography and titanium (Ti, W, or Ta etc.) hard mask based on dual photosensitive substrate dielectric build-up layers, in accordance with another embodiment of the present invention. Referring to FIG. 9, in (A) an incoming panel 902 has level patterned L1 Cu layers 904, which can represent a stack of layers formed using a combination of substrate dielectric build-up layer lamination, laser drilling, and semi-additive lithographic/electroplating processes. The layer 904 can also represent Cu bumps in Si for a BBUL die-package interface dual damascene structure. In (B), a photosensitive (PID) substrate dielectric build-up layer 906 lamination or spin-on liquid deposition is performed. In (C), a PVD Ti, W, or Ta etc. hard mask 908 deposition is performed to provide a layer of Ti, W, or Ta etc. to function as a hard mask layer. Patterning of the PVD Ti, W, or Ta etc. hard mask with a photoresist or hardmask layer 907 is carried out using plasma etch or wet etch, as shown in (D), with the result shown in (E) as patterned Ti, W, or Ta etc. hardmask 909. Also in (E), a L2 photosensitive (PID) substrate dielectric build-up layer 910 lamination or spin-on liquid deposition is performed. An align and photo-exposure of both PID substrate dielectric build-up layers (both trench 911 and via 913) is then performed, as shown in (F), using the Ti, W, or Ta etc. hardmask 909 to aid in controlling the exposure. In (G), the exposed trench and via on the dual PID (L2 and L1-L2) substrate dielectric build-up layer is developed. The hermetic thin film PVD Ti, W, or Ta etc. hard mask can be used to "develop stop" the developer. In (H), a PVD sputtered thin Ti, W, or Ta etc./Cu seed layer 912 (e.g., approximately 50 nm Ti, W, or Ta etc. and approximately 100-300 nm Cu) is deposited. Copper plating 914 of the dual damascene structure is then performed, as shown in (I). In (J), chemical mechanical planarization (CMP) of Cu overburden or use a flash etch wet process is performed. Then, Cu L2 capping and L2 substrate dielectric build-up layer capping using PECVD (with alternative embodiments including one or more of CVD/LPCVD/MOCVD/APCVD/PVD) dielectric layer 916 (e.g., SiN, SiON, etc, from a few up to 300 nm thick) is then performed, as shown in (K). It is to be understood that the process can subsequently include removing the structure of (K) from the insulator panel 902 as a package or package portion to ultimately house a semiconductor die, and to couple the metal routing layer 904 to external electrical contacts (e.g., bumps) of a semiconductor die. Alternatively, although not shown, the fabrication process of FIG. 9 may include performing the above described operation directly on or over a semiconductor die, such as a die disposed on a panel.

Figure 10A:
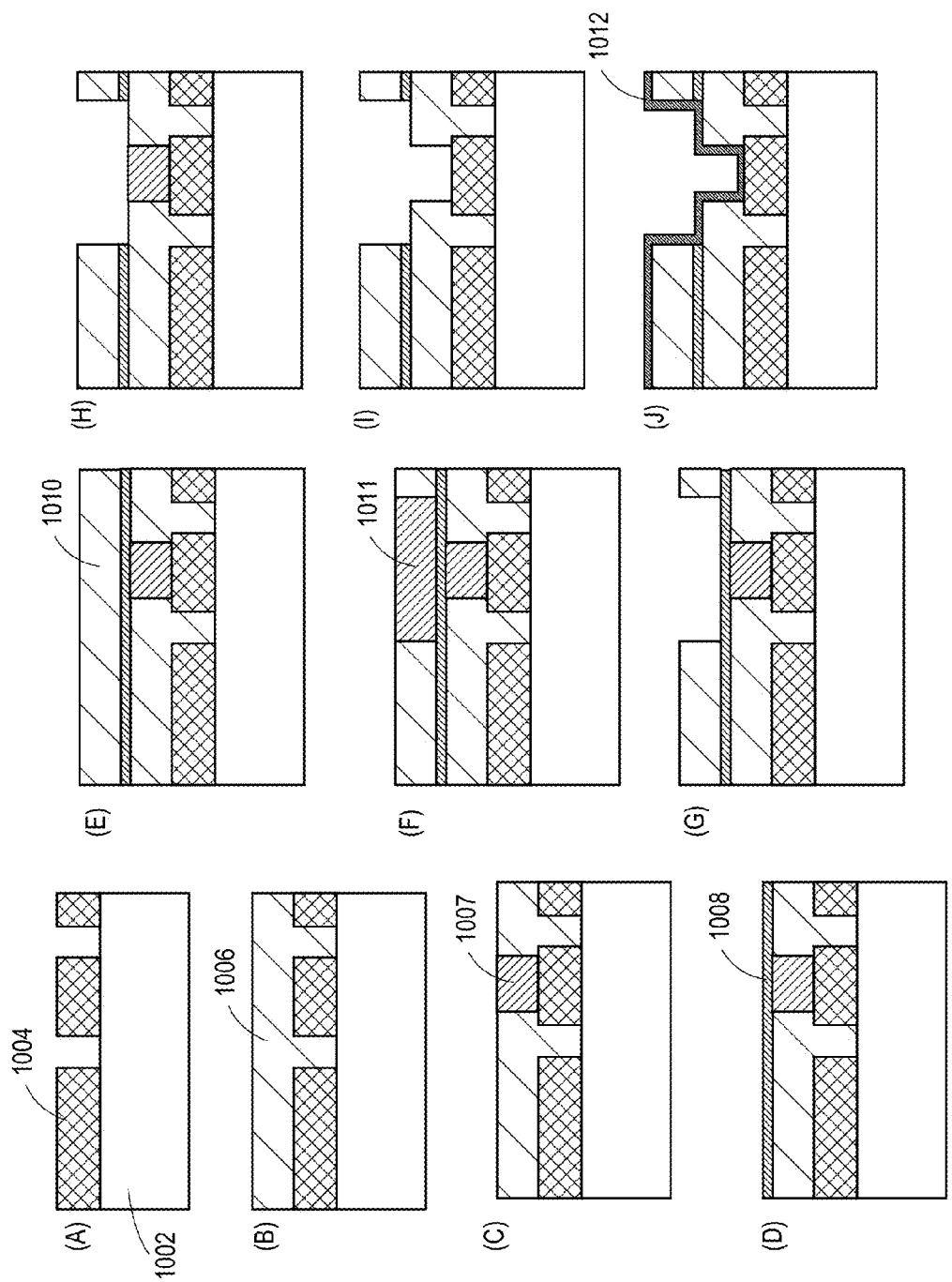
FIGS. 10A and 10B illustrate cross-sectional views of various operations in a process flow for build-up BBUL or substrate layers integration using dual damascene involving photolithography and SiN, SiC, or SiON, etc. stop layer based on dual photosensitive substrate build-up dielectric layers, in accordance with another embodiment of the present invention.
Figure 10B:
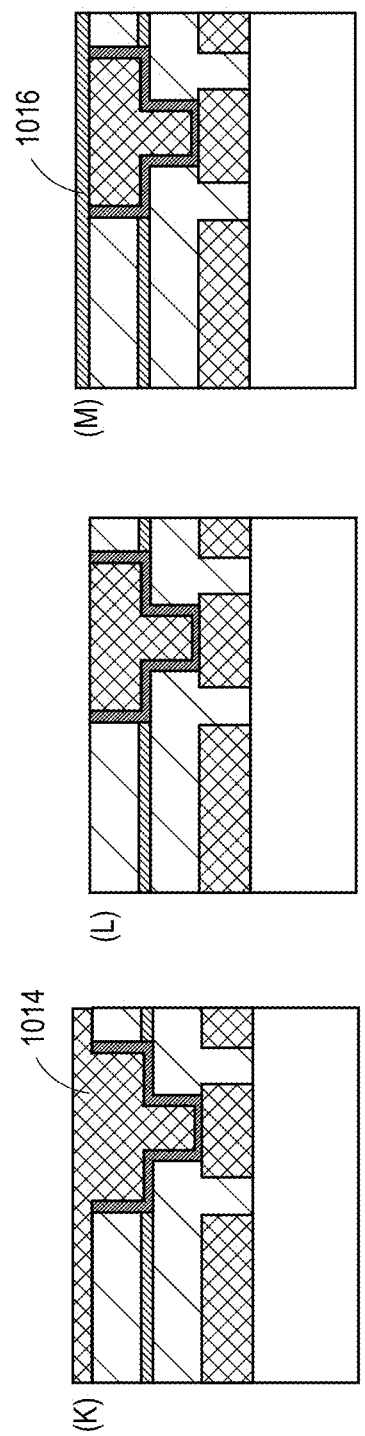

FIGS. 10A and 10B illustrate cross-sectional views of various operations in a process flow for build-up BBUL or substrate layers integration using dual damascene involving photolithography and SiN stop layer based on dual photosensitive substrate dielectric build-up layers, in accordance with another embodiment of the present invention. Referring to FIGS. 10A and 10B, in (A) an incoming panel 1002 has level patterned L1 Cu layers 1004, which can represent a stack of layers formed using a combination of substrate dielectric build-up layer lamination, laser drilling, and semi-additive lithographic/electroplating processes. The layer 1004 can also represent Cu bumps in Si for a BBUL die-package interface dual damascene structure. In (B), a photosensitive (PID) substrate dielectric build-up layer 1006 lamination or spin-on liquid deposition is performed. In (C), align and photo-exposure of the PID L1-L2 substrate dielectric build-up layer (via first 1007) is performed. A PECVD (with alternative embodiments including one or more of CVD/LPCVD/MOCVD/APCVD/PVD) deposition of a thin dielectric layer 1008 (e.g., SiN, SiON, etc. from a few up to ~300 nm thick) is performed to function as a develop/exposure stop layer, as shown in (D). In (E), a L2 photosensitive (PID) substrate dielectric build-up layer 1010 lamination or spin-on liquid deposition is performed. An align and photo-exposure of the PID L2 substrate dielectric build-up layer (trench 1011) is then performed, as shown in (F). In (G), the pre-exposed trench on the PID L2 substrate dielectric build-up layer is developed. The hermetic thin film PECVD (with alternative embodiments including one or more of CVD/LPCVD/MOCVD/APCVD/PVD) dielectric layer (in particular SiN) can be used to "develop stop" the developer. A plasma or wet etch is then used to remove the SiN layer, as shown in (H). In (I), the exposed via on the L1-L2 PID substrate dielectric build-up layer is developed. In (J), a PVD sputtered thin Ti, W, or Ta etc./Cu seed layer 1012 (e.g., approximately 50 nm Ti, W, or Ta etc. and approximately 100-300 nm Cu) is deposited. Copper plating 1014 of the dual damascene structure is then performed, as shown in (K). In (L), chemical mechanical planarization (CMP) of Cu overburden or use a flash etch wet process is performed. Then, Cu L2 capping and L2 substrate dielectric build-up layer capping using PECVD (with alternative embodiments including one or more of CVD/LPCVD/MOCVD/APCVD/PVD) dielectric layer 1016 (e.g., SiN, SiON, etc, from 20-300 nm thick) is then performed, as shown in (M). It is to be understood that the process can subsequently include removing the structure of (M) from the insulator panel 1002 as a package or package portion to ultimately house a semiconductor die, and to couple the metal routing layer 1004 to external electrical contacts (e.g., bumps) of a semiconductor die. Alternatively, although not shown, the fabrication process of FIGS. 10A and 10B may include performing the above described operation directly on or over a semiconductor die, such as a die disposed on a panel.

With reference again to FIGS. 1-7, 8A, 8B, 9, 10A and 10B, thin dielectric layers may be incorporated during fabrication of related BBUL layers. Thus, the described thin dielectric layer may be part of a larger BBUL system. In general, BBUL is a processor packaging technology that is bumpless since it does not use the usual small solder bumps to attach the silicon die to the processor package wires. It has build-up layers since it is grown or built-up around the silicon die. Some semiconductor packages now use a coreless substrate, which does not include the thick resin core layer commonly found in conventional substrates. In an embodiment, as part of the BBUL process, electrically conductive vias and routing layers are formed above the active side of a semiconductor die using a semi-additive process (SAP) to complete remaining layers.

A thin dielectric layer may be formed as a BBUL layer during packaging of a semiconductor die on a panel of a carrier. The carrier may be provided having planar panels or panels with a plurality of cavities disposed therein, each sized to receive a semiconductor die. During processing, identical structures may be mated in order to build a back-to-back apparatus for processing utility. Consequently, processing throughput is effectively doubled. For example, a carrier may include panels with 1000 recesses on either side, allowing for fabrication of 2000 individual packages from a single carrier. The panel may include an adhesion release layer and an adhesive binder. A cutting zone may be provided at each end of the apparatus for separation processing. A backside of a semiconductor die may be bonded to the panel with a die-bonding film. Encapsulating layers may be formed by a lamination process. In another embodiment, one or more encapsulation layers may be formed by spinning on and curing a dielectric upon a wafer-scale array of apparatuses.

Regarding the overall packaging processes described in association with FIGS. 5-7, 8A, 8B, 9, 10A and 10B, in an embodiment, the substrate formed is a coreless substrate since a panel is used to support the packaging of a semiconductor die through to formation of an array of external conductive conducts. The panel is then removed to provide a coreless package for the semiconductor die. Accordingly, in an embodiment, the term "coreless" is used to mean that the support upon which the package was formed for housing a die is ultimately removed at the end of a build-up process. In a specific embodiment, a coreless substrate is one that does not include a thick core after completion of the fabrication process. As an example, a thick core may be one composed of a reinforced material such as is used in a motherboard and may include conductive vias therein. It is to be understood that die-bonding film may be retained or may be removed. In either case, inclusion or exclusion of a die-bonding film following removal of the panel provides a coreless substrate. Still further, the substrate may be considered a coreless substrate because it does not include a thick core such as a fiber reinforced glass epoxy resin.

In an embodiment, an active surface of the packaged semiconductor die includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments. In another embodiment, more than one die is embedded in the same package. For example, in one embodiment, a packaged semiconductor die further includes a secondary stacked die. The first die may have one or more through-silicon vias disposed therein (TSV die). The second die may be electrically coupled to the TSV die through the one or more through-silicon vias. In one embodiment, both dies are embedded in a coreless substrate.

The packaged semiconductor die may, in an embodiment, be a fully embedded and surrounded semiconductor die. As used in this disclosure, "fully embedded and surrounded" means that all surfaces of the semiconductor die are in contact with an encapsulating film (such as a dielectric layer) of substrate, or at least in contact with a material housed within the encapsulating film. Said another way, "fully embedded and surrounded" means that all exposed surfaces of the semiconductor die are in contact with the encapsulating film of a substrate.

The packaged semiconductor die may, in an embodiment, be a fully embedded semiconductor die. As used in this disclosure, "fully embedded" means that an active surface and the entire sidewalls of the semiconductor die are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the semiconductor die are in contact with the encapsulating film of a substrate. However, in such cases, the semiconductor die is not "surrounded" since the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a coreless substrate), or in contact with a material housed within the encapsulating film.

As mentioned briefly above, an array of external conductive contacts may subsequently be formed. In an embodiment, the external conductive contacts couple the formed substrate to a foundation substrate. The external conductive contacts may be used for electrical communication with the foundation substrate. In one embodiment, the array of external conductive contacts is a ball grid array (BGA). In other embodiments, the array of external conductive contacts is an array such as, but not limited to, a land grid array (LGA) or an array of pins (PGA).

Figure 11:
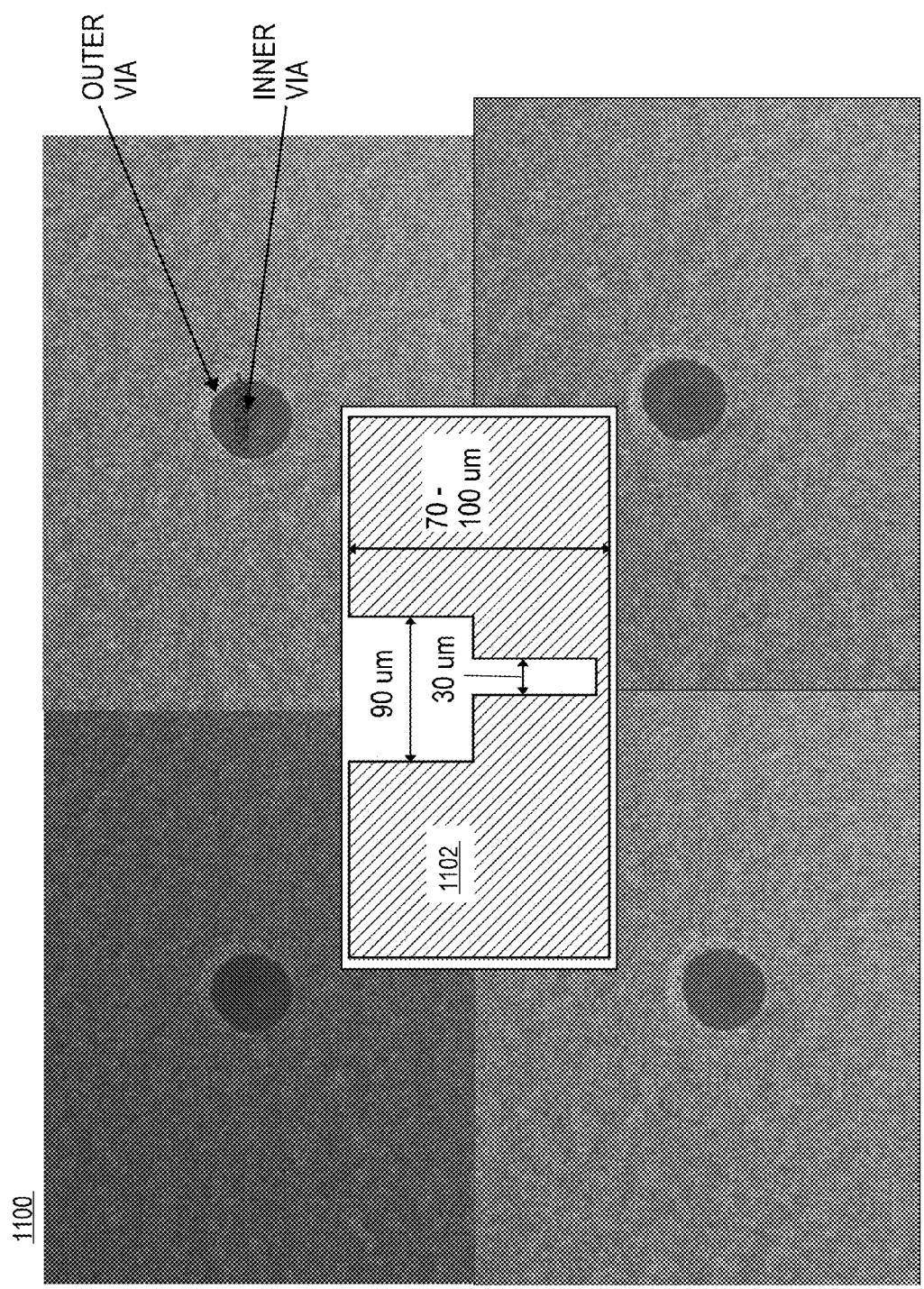
FIG. 11 includes top down images and a corresponding cross-sectional illustration demonstrating dual damascene using a laser drilling via first-trench last approach, in accordance with an embodiment of the present invention.

FIG. 11 includes top down images 1100 and a corresponding cross-sectional illustration 1102 demonstrating dual damascene using a laser drilling via first-trench last approach, in accordance with an embodiment of the present invention. Referring to FIG. 11, the substrate dielectric build-up layer thickness is approximately in the range of 70-100 microns. An inner via (smaller via) has an approximately 30 micron top diameter, while and outer via (bigger via) has an approximately 90 micron top diameter. A single laser recipe was used, with depth controlled by the number of shots and thickness of the substrate dielectric build-up layer. In one embodiment, an aspect ratio of 1:1 of diameter to depth is used.

Figure 12:
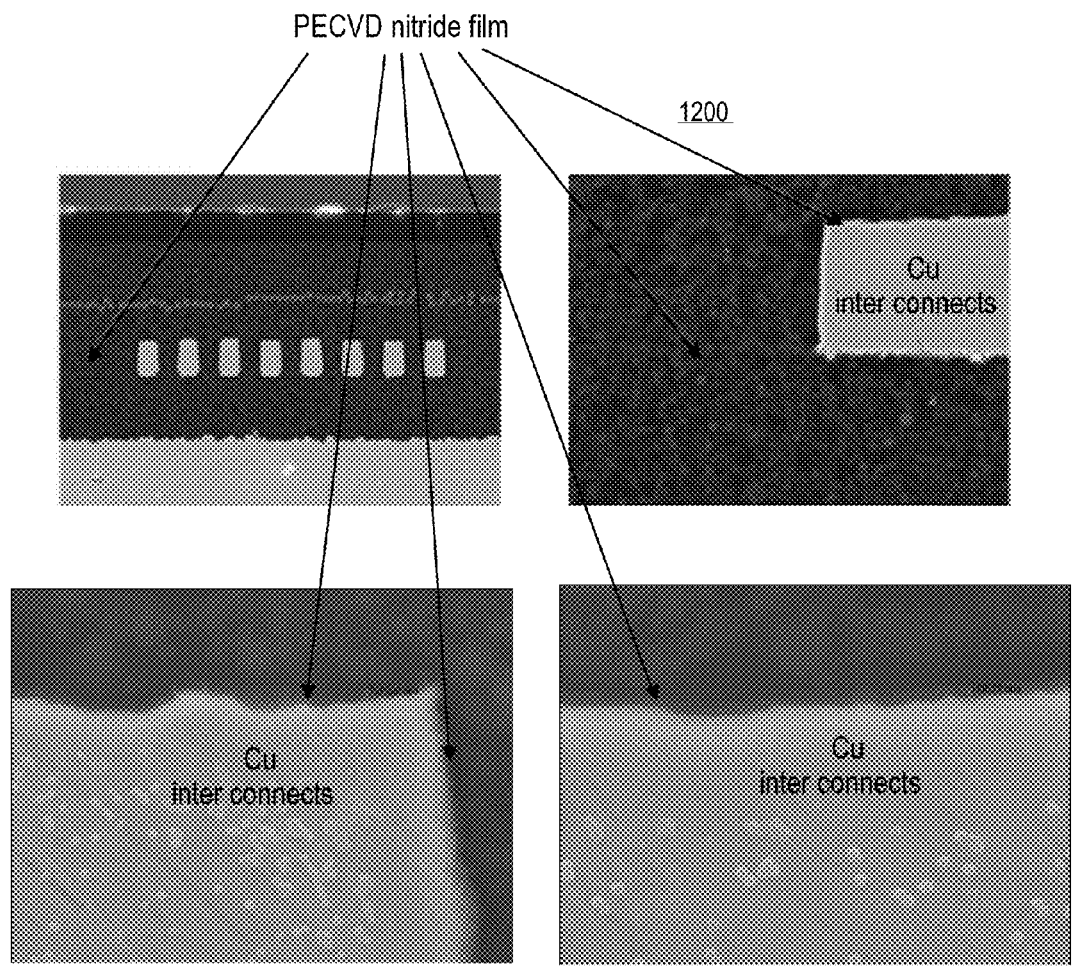
FIG. 12 includes cross-sectional SEM images of technology building blocks for dual damascene demonstrating a PECVD (with alternative embodiments including one or more of—CVD/LPCVD/MOCVD/APCVD/PVD) SiN thin film capping copper (Cu) interconnects and, also, in between dual substrate build-up dielectric layers, in accordance with an embodiment of the present invention.

FIG. 12 includes cross-sectional SEM images 1200 of technology building blocks for dual damascene demonstrating a PECVD (with alternative embodiments including one or more of CVD/LPCVD/MOCVD/APCVD/PVD) SiN thin film capping copper (Cu) interconnects and, also, in between dual substrate dielectric build-up layers, in accordance with an embodiment of the present invention. In one embodiment, the PECVD (with alternative embodiments including one or more of CVD/LPCVD/MOCVD/APCVD/PVD) SiN film has a thickness approximately in the range of 50 nm to 300 nm.

Figure 13:
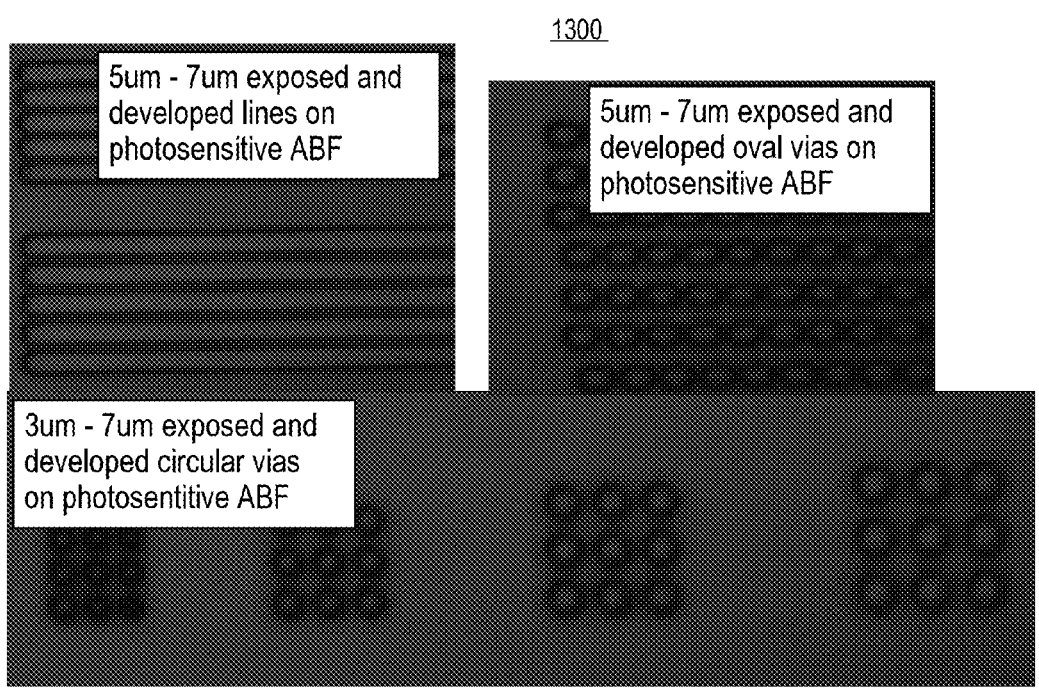
FIG. 13 includes magnified images demonstrating patterning of photosensitive substrate build-up dielectric layers, in accordance with an embodiment of the present invention.

FIG. 13 includes magnified images 1300 demonstrating patterning of photosensitive substrate dielectric build-up layers, in accordance with an embodiment of the present invention. Referring to FIG. 13, lines, oval vias, and circular vias are demonstrated.

Figure 14:
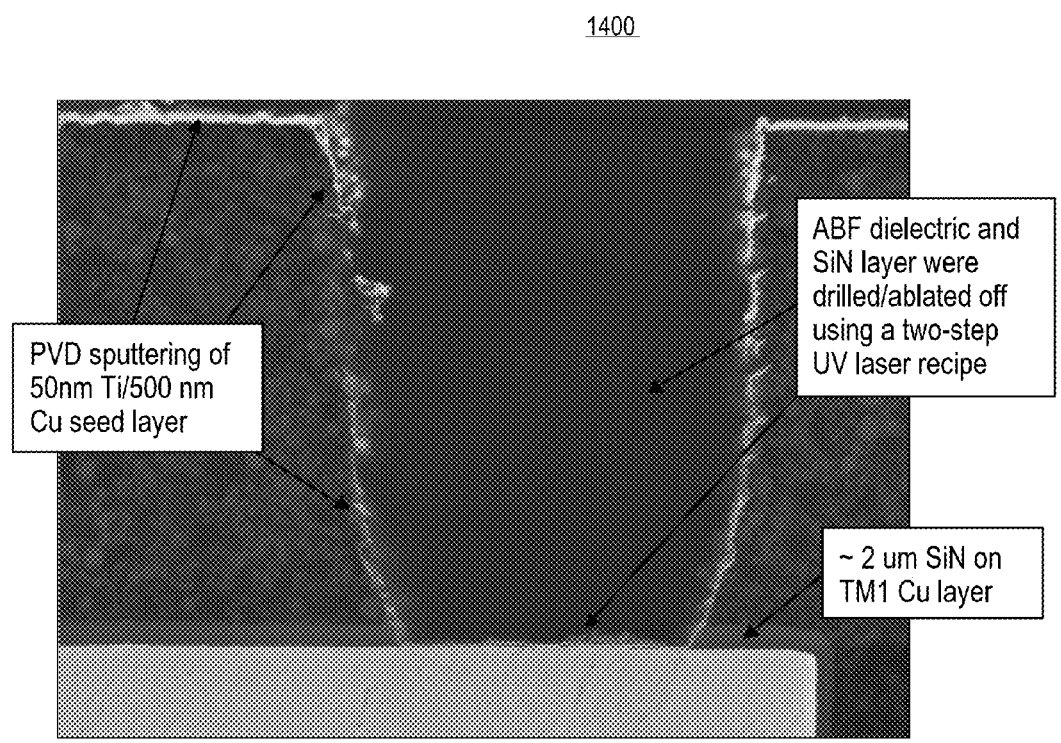
FIG. 14 is cross-sectional SEM image demonstrating technology building blocks of embedded die-package interface BBUL integration, in accordance with an embodiment of the present invention.

FIG. 14 is cross-sectional SEM image 1400 demonstrating technology building blocks of embedded die-package interface BBUL integration, in accordance with an embodiment of the present invention. Referring to FIG. 14, UV laser for drilling through substrate dielectric build-up layer and SiN layer, along with integration of PVD sputtered Ti, W, or Ta etc. Cu seed layer subsequent electroplating is demonstrated.

Figure 15:
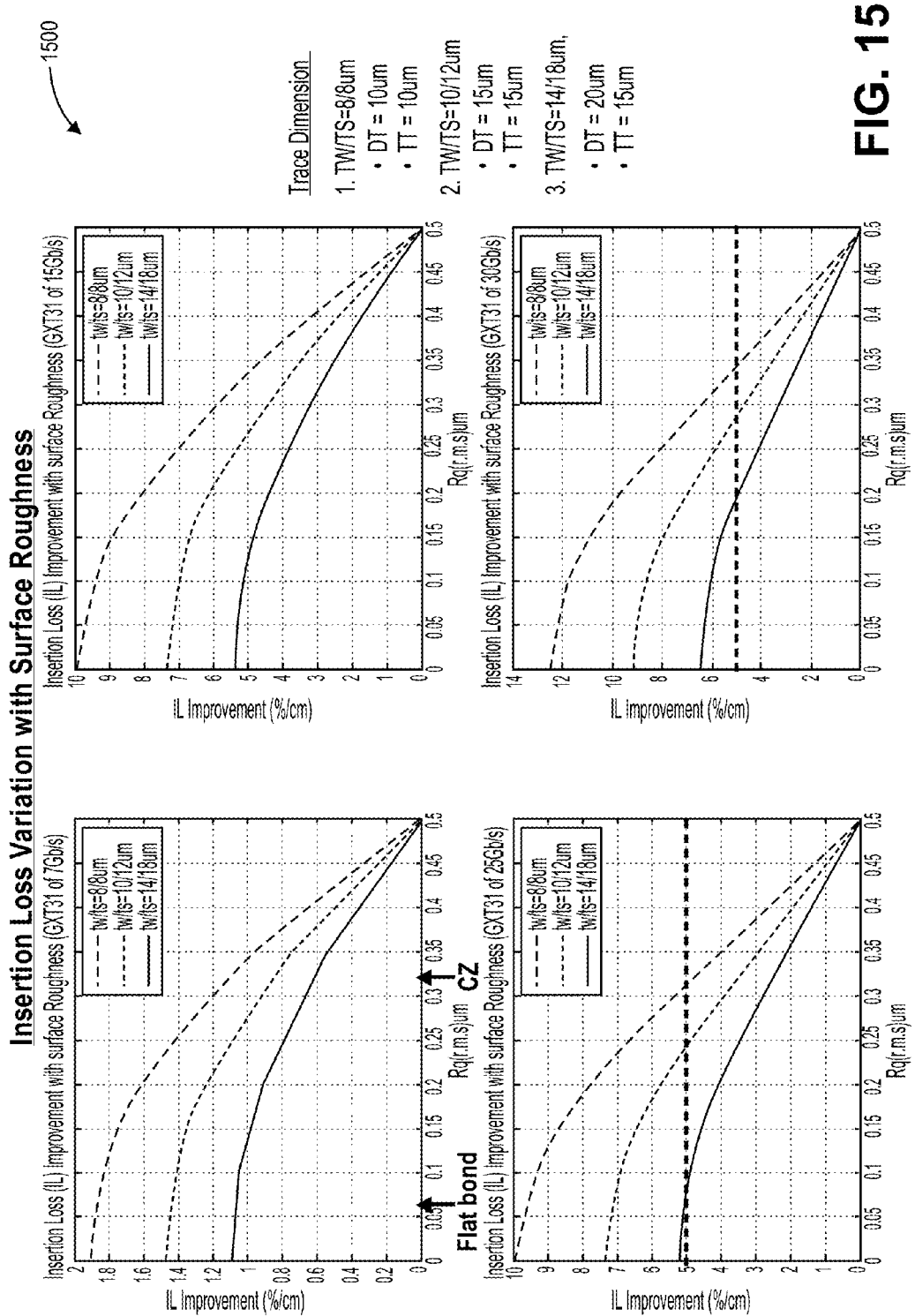
FIG. 15 includes a plurality of plots showing simulations for insertion loss variation with surface roughness, in accordance with an embodiment of the present invention.

FIG. 15 includes a plurality of plots 1500 showing simulations for insertion loss variation with surface roughness, in accordance with an embodiment of the present invention. Referring to FIG. 15, an insertion loss improvement of up to 10% per cm for 30 Gb/s performance on 8 um/8 um trace width/trace spacing on a conservative, equivalent Rq of 200 nm enabled by SiN capping on interconnect traces is demonstrated.

Figure 16:
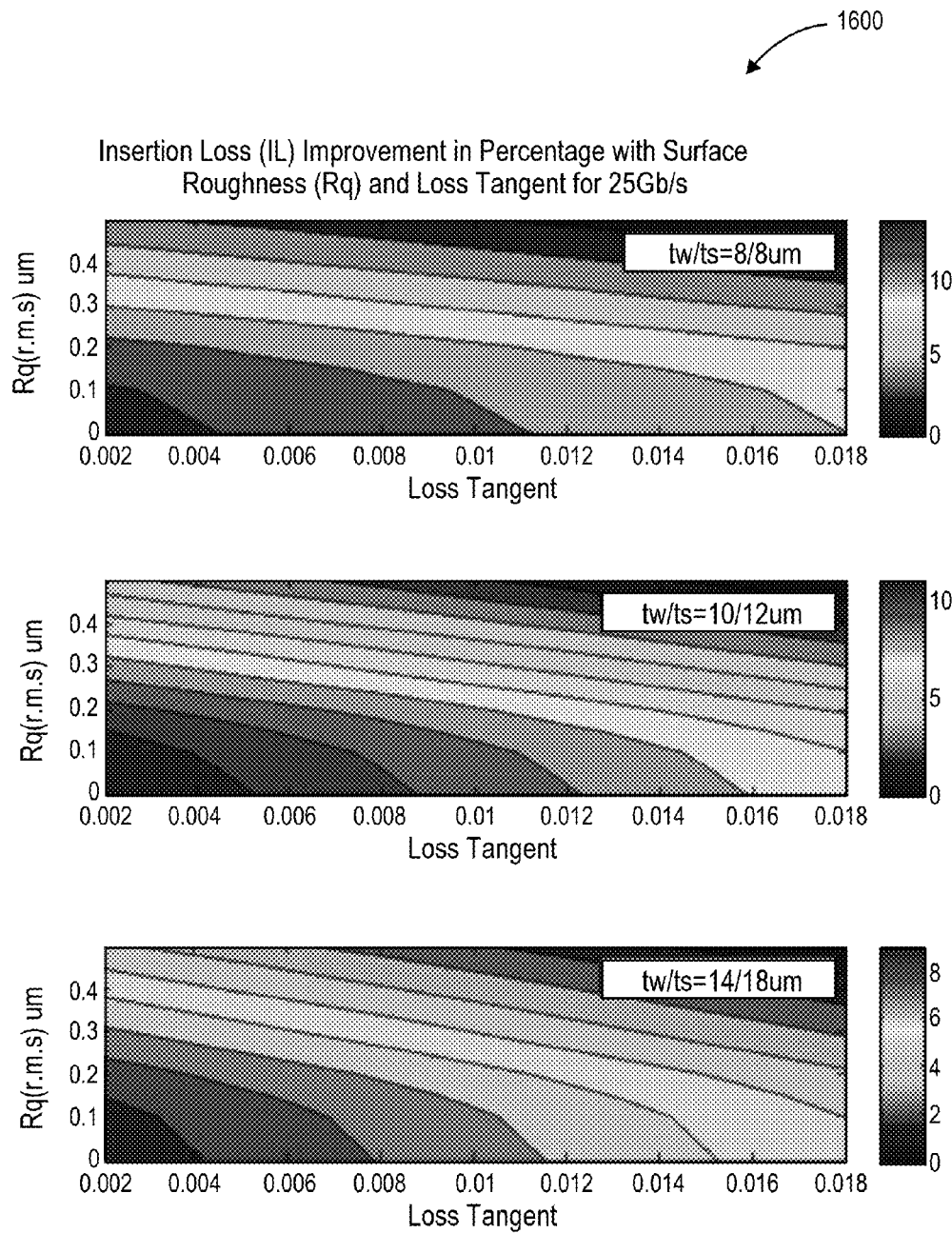
FIG. 16 includes a plurality of plots showing simulations for insertion loss variation with surface roughness and dielectric loss tangent, in accordance with an embodiment of the present invention.

FIG. 16 includes a plurality of plots 1600 showing simulations for insertion loss variation with surface roughness and dielectric loss tangent, in accordance with an embodiment of the present invention. Referring to FIG. 16, an insertion loss improvement of up to 13% per cm for 25 Gb/s performance on 8 um/8 um trace width/trace spacing on a conservative, equivalent Rq of 200 nm enabled by SiN capping on interconnect traces is demonstrated.

Overall, one or more embodiments described herein may be used to enable future scaling of packaging interconnect technologies for high bandwidth applications beyond 8 um/8 um FLS. Embodiments can involve enablement of high-bandwidth communication on the same package with FLS beyond 8 um/8 um packaging interconnect lines. Embodiments of the present invention may be suitable for fabricating a system on a chip (SOC), e.g., for a smartphone or a tablet as well as other systems. Although described in detail above for a BBUL process, other process flows may be used instead. For example, in another embodiment, a semiconductor die is housed in a core of a substrate. In another embodiment, fan-out layers are used.

Figure 17:
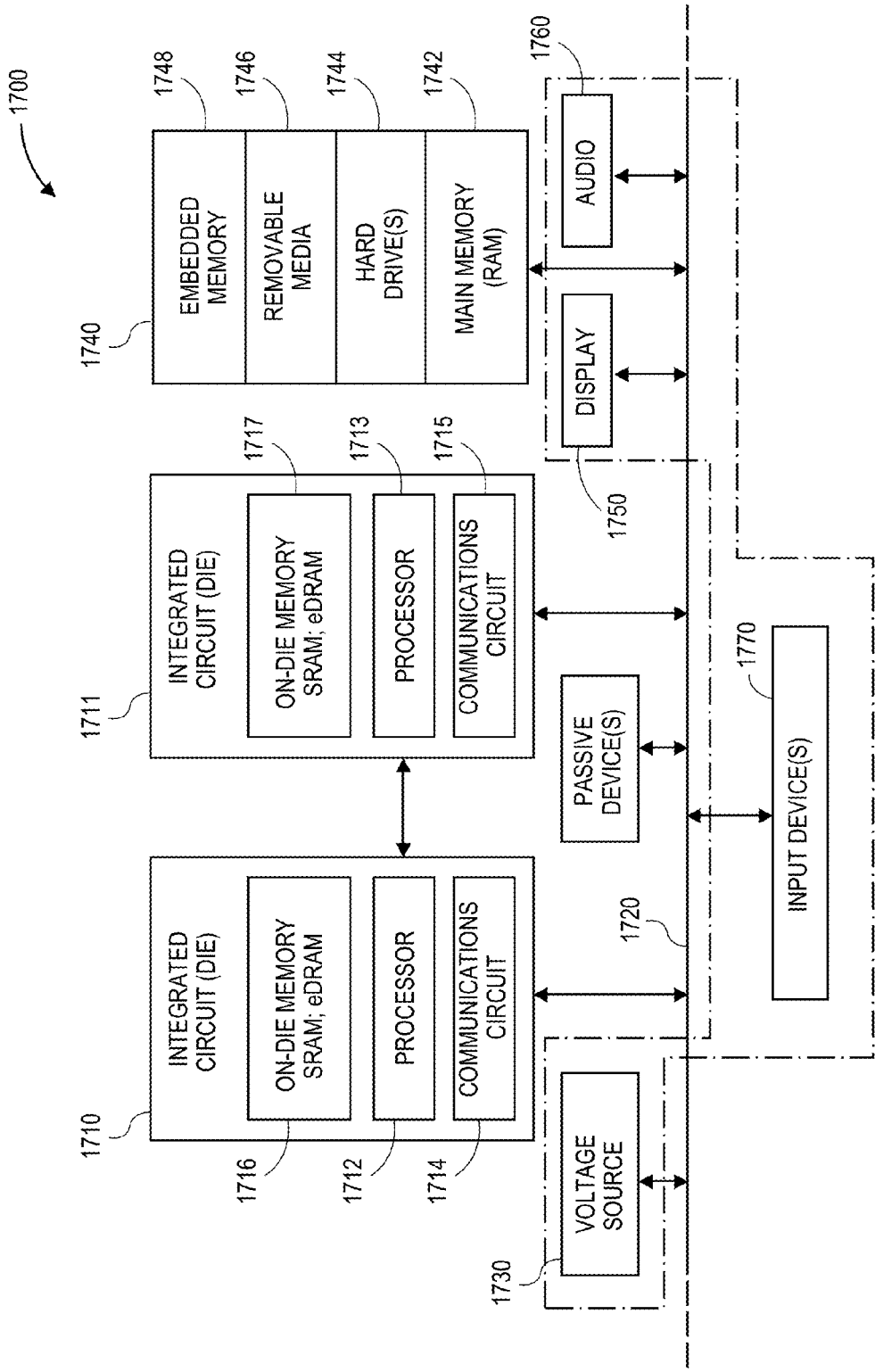
FIG. 17 is a schematic of a computer system, in accordance with an embodiment of the present invention.

FIG. 17 is a schematic of a computer system 1700, in accordance with an embodiment of the present invention. The computer system 1700 (also referred to as the electronic system 1700) as depicted can embody a BBUL semiconductor package having an ultra-thin dielectric layer according to any of the several disclosed embodiments and their equivalents as set forth in this disclosure. The computer system 1700 may be a mobile device such as a netbook computer. The computer system 1700 may be a mobile device such as a wireless smart phone. The computer system 1700 may be a desktop computer. The computer system 1700 may be a hand-held reader. The computer system 1700 may be a watch.

In an embodiment, the electronic system 1700 is a computer system that includes a system bus 1720 to electrically couple the various components of the electronic system 1700. The system bus 1720 is a single bus or any combination of busses according to various embodiments. The electronic system 1700 includes a voltage source 1730 that provides power to the integrated circuit 1710. In some embodiments, the voltage source 1730 supplies current to the integrated circuit 1710 through the system bus 1720.

The integrated circuit 1710 is electrically coupled to the system bus 1720 and includes any circuit, or combination of circuits according to an embodiment. In an embodiment, the integrated circuit 1710 includes a processor 1712 that can be of any type. As used herein, the processor 1712 may mean any type of circuit such as, but not limited to, a microprocessor, a microcontroller, a graphics processor, a digital signal processor, or another processor. In an embodiment, the processor 1712 includes or is included in a BBUL semiconductor package having an ultra-thin dielectric layer, as disclosed herein. In an embodiment, SRAM embodiments are found in memory caches of the processor. Other types of circuits that can be included in the integrated circuit 1710 are a custom circuit or an application-specific integrated circuit (ASIC), such as a communications circuit 1714 for use in wireless devices such as cellular telephones, smart phones, pagers, portable computers, two-way radios, and similar electronic systems. In an embodiment, the processor 1710 includes on-die memory 1716 such as static random-access memory (SRAM). In an embodiment, the processor 1710 includes embedded on-die memory 1716 such as embedded dynamic random-access memory (eDRAM).

In an embodiment, the integrated circuit 1710 is complemented with a subsequent integrated circuit 1711. Useful embodiments include a dual processor 1713 and a dual communications circuit 1715 and dual on-die memory 1717 such as SRAM. In an embodiment, the dual integrated circuit 1710 includes embedded on-die memory 1717 such as eDRAM.

In an embodiment, the electronic system 1700 also includes an external memory 1740 that in turn may include one or more memory elements suitable to the particular application, such as a main memory 1742 in the form of RAM, one or more hard drives 1744, and/or one or more drives that handle removable media 1746, such as diskettes, compact disks (CDs), digital variable disks (DVDs), flash memory drives, and other removable media known in the art. The external memory 1740 may also be embedded memory 1448 such as a single die memory or a TSV die stack, according to an embodiment.

In an embodiment, the electronic system 1700 also includes a display device 1750 and an audio output 1760. In an embodiment, the electronic system 1700 includes an input device such as a controller 1770 that may be a keyboard, mouse, trackball, game controller, microphone, voice-recognition device, or any other input device that inputs information into the electronic system 1700. In an embodiment, an input device 1770 is a camera. In an embodiment, an input device 1770 is a digital sound recorder. In an embodiment, an input device 1770 is a camera and a digital sound recorder.

As shown herein, the integrated circuit 1710 may be implemented in a number of different embodiments, including a BBUL semiconductor package having an ultra-thin dielectric layer according to any of the several disclosed embodiments and their equivalents, an electronic system, a computer system, one or more methods of fabricating an integrated circuit, and one or more methods of fabricating an electronic assembly that includes a BBUL semiconductor package having an ultra-thin dielectric layer according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed BBUL semiconductor package having an ultra-thin dielectric layer embodiments and their equivalents. A foundation substrate may be included, as represented by the dashed line of FIG. 17. Passive devices may also be included, as is also depicted in FIG. 17.

Thus, embodiments of the present invention include bumpless build-up layer (BBUL) semiconductor packages with ultra-thin dielectric layers.

In an embodiment, an apparatus includes a semiconductor die including an integrated circuit having a plurality of external conductive bumps. A semiconductor package houses the semiconductor die. The semiconductor package includes a dielectric layer disposed above the plurality of external conductive bumps. A conductive via is disposed in the dielectric layer and coupled to one of the plurality of conductive bumps. A conductive line is disposed on the dielectric layer and coupled to the conductive via.

In one embodiment, the dielectric layer of the semiconductor package includes one or more substrate dielectric build-up layers.

In one embodiment, the apparatus further includes a silicon nitride layer disposed between the plurality of conductive bumps and the dielectric layer of the semiconductor package. The conductive via is disposed in the silicon nitride layer.

In one embodiment, the apparatus further includes a silicon nitride layer disposed on the conductive line and on exposed portions of the dielectric layer of the semiconductor package.

In one embodiment, the conductive line of the semiconductor package is included in a conductive routing pattern of the semiconductor package. The conductive routing pattern has a fine line spacing (FLS) of less than 8 micron/8 micron FLS.

In one embodiment, the plurality of bumps, the conductive via, and the conductive line are composed of copper.

In one embodiment, the semiconductor package includes or is a bumpless build-up layer (BBUL) substrate.

In an embodiment, a semiconductor package includes a layer having a pattern of spaced apart conductive lines. A first dielectric layer is disposed on and between the conductive lines of the pattern of spaced apart conductive lines. A second dielectric layer is disposed above the first dielectric layer. A conductive via is disposed in the first dielectric layer. A conductive routing line is disposed in the second dielectric layer and coupled to the conductive via.

In one embodiment, the first and second dielectric layers are substrate dielectric build-up layers.

In one embodiment, the first and second dielectric layers are non-photo-definable substrate dielectric build-up layers.

In one embodiment, the first dielectric layer is a non-photo-definable substrate dielectric build-up layer, and the second dielectric layer is a photo-definable substrate dielectric build-up layer.

In one embodiment, the first dielectric layer is a photo-definable substrate dielectric build-up layer, and the second dielectric layer is a non-photo-definable substrate dielectric build-up layer.

In one embodiment, the first and second dielectric layers are photo-definable substrate dielectric build-up layers.

In one embodiment, the semiconductor package further includes a silicon nitride layer disposed directly between the first and second dielectric layers. The conductive via is disposed in the silicon nitride layer.

In one embodiment, the semiconductor package further includes a silicon nitride layer disposed on the conductive routing line and on exposed portions of the second dielectric layer.

In one embodiment, the semiconductor package further includes a patterned titanium nitride layer disposed directly between the first and second dielectric layers. The conductive via is disposed in the patterned titanium nitride layer, and the conductive routing line is disposed on the patterned titanium nitride layer.

In one embodiment, the pattern of spaced apart conductive lines has a fine line spacing (FLS) of less than 8 micron/8 micron FLS.

In one embodiment, the pattern of spaced apart conductive lines, the conductive via, and the conductive routing line are composed of copper.

In one embodiment, an apparatus includes a semiconductor die including an integrated circuit having a plurality of external electrical contacts. The apparatus also includes a semiconductor package housing the semiconductor die. The semiconductor package includes a layer having a pattern of spaced apart conductive lines coupled to the plurality of external contacts of the semiconductor die. A first dielectric layer is disposed on and between the conductive lines of the pattern of spaced apart conductive lines. A second dielectric layer is disposed above the first dielectric layer. A conductive via is disposed in the first dielectric layer. A conductive routing line is disposed in the second dielectric layer and coupled to the conductive via.

In one embodiment, the plurality of external electrical contacts is a plurality of external bumps.

In one embodiment, the first and second dielectric layers of the semiconductor package are substrate dielectric build-up layers.

In one embodiment, one or both of the first and second dielectric layers is a photo-definable substrate dielectric build-up layer.

In one embodiment, the semiconductor package further includes a first silicon nitride layer disposed directly between the first and second dielectric layers. The conductive via is disposed in the first silicon nitride layer. A second silicon nitride layer is disposed on the conductive routing line and on exposed portions of the second dielectric layer.

In one embodiment, the semiconductor package further includes a patterned titanium nitride layer disposed directly between the first and second dielectric layers. The conductive via is disposed in the patterned titanium nitride layer, and the conductive routing line is disposed on the patterned titanium nitride layer.

In one embodiment, the pattern of spaced apart conductive lines of the semiconductor package has a fine line spacing (FLS) of less than 8 micron/8 micron FLS.

What is claimed is:

1. A semiconductor package, comprising:
   a layer comprising a pattern of spaced apart conductive lines;
   a first dielectric layer disposed on and between the conductive lines of the pattern of spaced apart conductive lines;
   a second dielectric layer disposed above the first dielectric layer;
   a conductive via disposed in the first dielectric layer;
   a conductive routing line disposed in the second dielectric layer and coupled to the conductive via; and
   a patterned titanium nitride layer disposed directly between the first and second dielectric layers, wherein the conductive via is disposed in the patterned titanium nitride layer, and the conductive routing line is disposed on the patterned titanium nitride layer.

2. The semiconductor package of claim 1, wherein the first and second dielectric layers are substrate dielectric build-up layers.

3. The semiconductor package of claim 2, wherein the first and second dielectric layers are non-photo-definable substrate dielectric build-up layers.

4. The semiconductor package of claim 2, wherein the first dielectric layer is a non-photo-definable substrate dielectric build-up layer, and the second dielectric layer is a photo-definable substrate dielectric build-up layer.

5. The semiconductor package of claim 2, wherein the first dielectric layer is a photo-definable substrate dielectric build-up layer, and the second dielectric layer is a non-photo-definable substrate dielectric build-up layer.

6. The semiconductor package of claim 2, wherein the first and second dielectric layers are photo-definable substrate dielectric build-up layers.

7. The semiconductor package of claim 1, further comprising:
 a silicon nitride layer disposed on the conductive routing line and on exposed portions of the second dielectric layer.

8. The semiconductor package of claim 1, wherein the pattern of spaced apart conductive lines has a fine line spacing (FLS) of less than 8 micron/8 micron FLS.

9. The semiconductor package of claim 1, wherein the pattern of spaced apart conductive lines, the conductive via, and the conductive routing line all comprise copper.

10. An apparatus, comprising:
 a semiconductor die comprising an integrated circuit having a plurality of external electrical contacts; and
 a semiconductor package housing the semiconductor die, the semiconductor package comprising:
  a layer comprising a pattern of spaced apart conductive lines coupled to the plurality of external contacts of the semiconductor die;
  a first dielectric layer disposed on and between the conductive lines of the pattern of spaced apart conductive lines;
  a second dielectric layer disposed above the first dielectric layer;
  a conductive via disposed in the first dielectric layer;
  a conductive routing line disposed in the second dielectric layer and coupled to the conductive via; and
  a patterned titanium nitride layer disposed directly between the first and second dielectric layers, wherein the conductive via is disposed in the patterned titanium nitride layer, and the conductive routing line is disposed on the patterned titanium nitride layer.

11. The apparatus of claim 10, wherein the plurality of external electrical contacts is a plurality of external bumps.

12. The apparatus of claim 10, wherein the first and second dielectric layers of the semiconductor package are substrate dielectric build-up layers.

13. The apparatus of claim 12, wherein one or both of the first and second dielectric layers is a photo-definable substrate dielectric build-up layer.

14. The apparatus of claim 10, the semiconductor package further comprising:
 a second silicon nitride layer disposed on the conductive routing line and on exposed portions of the second dielectric layer.

15. The apparatus of claim 10, wherein the pattern of spaced apart conductive lines of the semiconductor package has a fine line spacing (FLS) of less than 8 micron/8 micron FLS.

* * * * *